(12) United States Patent
Peng et al.

(10) Patent No.: US 11,257,950 B2
(45) Date of Patent: Feb. 22, 2022

(54) SEMICONDUCTOR STRUCTURE AND MANUFACTURING METHOD FOR THE SEMICONDUCTOR STRUCTURE

(71) Applicant: TAIWAN SEMICONDUCTOR MANUFACTURING COMPANY LTD., Hsinchu (TW)

(72) Inventors: Chun-Yen Peng, Hsinchu (TW); Chih-Yu Chang, New Taipei (TW); Bo-Feng Young, Taipei (TW); Te-Yang Lai, Hsinchu (TW); Sai-Hooi Yeong, Hsinchu County (TW); Chi On Chui, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 25 days.

(21) Appl. No.: 16/799,215

(22) Filed: Feb. 24, 2020

(65) Prior Publication Data

US 2021/0265507 A1 Aug. 26, 2021

(51) Int. Cl.
*H01L 21/02* (2006.01)
*H01L 21/28* (2006.01)
*H01L 29/78* (2006.01)
*H01L 29/51* (2006.01)
*H01L 29/66* (2006.01)
*H01L 29/06* (2006.01)

(52) U.S. Cl.
CPC .... *H01L 29/78391* (2014.09); *H01L 21/0228* (2013.01); *H01L 21/02181* (2013.01); *H01L 21/02356* (2013.01); *H01L 29/0673* (2013.01); *H01L 29/516* (2013.01); *H01L 29/517* (2013.01); *H01L 29/6684* (2013.01); *H01L 29/66545* (2013.01); *H01L 29/66795* (2013.01); *H01L 29/785* (2013.01); *H01L 29/7842* (2013.01)

(58) Field of Classification Search
None
See application file for complete search history.

(56) References Cited

U.S. PATENT DOCUMENTS

| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |

(Continued)

OTHER PUBLICATIONS

S. Kirbach et al., Piezoelectric Hafnium Oxide Thin Films for Energy-Harvesting Applications, Proceedings of 2018 IEEE-NANO, Fraunhofer Center Nanoelectronic Technologies (CNT), Konigsbrucker Straße 178, 01099 Dresden, Germany.

(Continued)

*Primary Examiner* — Joseph C. Nicely
*Assistant Examiner* — Lamont B Koo
(74) *Attorney, Agent, or Firm* — WPAT, P.C., Intellectual Property Attorneys; Anthony King

(57) ABSTRACT

The present disclosure provides a semiconductor device, including a substrate, a metal gate layer over the substrate, a channel between a source region and a drain region in the substrate, and a ferroelectric layer between the metal gate layer and the substrate, wherein the ferroelectric layer is configured to cause a strain in the channel when applied with an electrical field.

20 Claims, 30 Drawing Sheets

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 2011/0248322 A1 | 10/2011 | Wong et al. | |
| 2019/0207009 A1* | 7/2019 | Yamaguchi | H01L 29/516 |
| 2020/0066511 A1* | 2/2020 | Karpov | H01L 29/516 |
| 2020/0365733 A1* | 11/2020 | Song | H01L 29/66545 |

OTHER PUBLICATIONS

F. S. Böscke et al., Ferroelectricity in hafnium oxide thin films, Applied Physics Letters 99, 102903 (2011).
F-RAM computer definition, Your Dictionary, LoveToKnow Corp.
Son Hoang Le et al., Characterization of ferroelectric thin films materials for FeRAM, Delft University of Technology.
Akira Onodera et al,. Ferroelectricity in Simple Binary Crystals, Crystals 2017, 7, 232.

\* cited by examiner

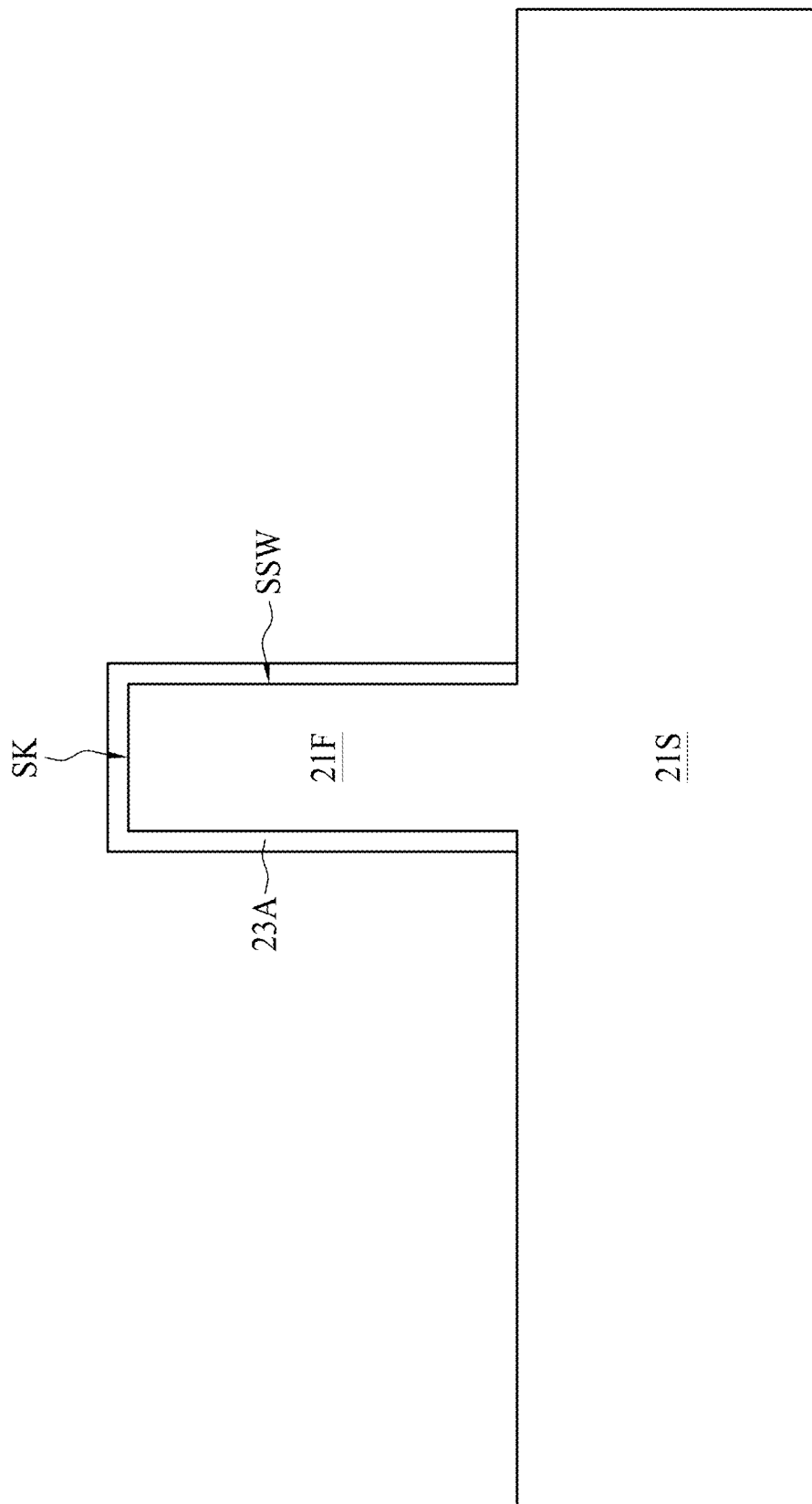

SEMICONDUCTOR STRUCTURE AND MANUFACTURING METHOD FOR THE SEMICONDUCTOR STRUCTURE

BACKGROUND

Transistor's performance in terms of operational speed can be improved by introducing strain in a transistor channel, wherein carrier mobility can be improved. The stress can be compressive or tensile. For example, a compressive strain may be desirable for p-channel transistor, such as p-type Metal-Oxide-Semiconductor Field-Effect Transistor (p-MOSFET); and a tensile strain may be desirable for n-channel transistor, such as n-type Metal-Oxide-Semiconductor Field-Effect Transistor (n-MOSFET). Other types of devices may also be optimized by adjusting strain therein.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9B to FIG. 9G are cross sectional views of a fin field effect transistor during intermediate stages of manufacturing operations, according to some embodiments of the present disclosure.

DETAILED DESCRIPTION

Figure 1:
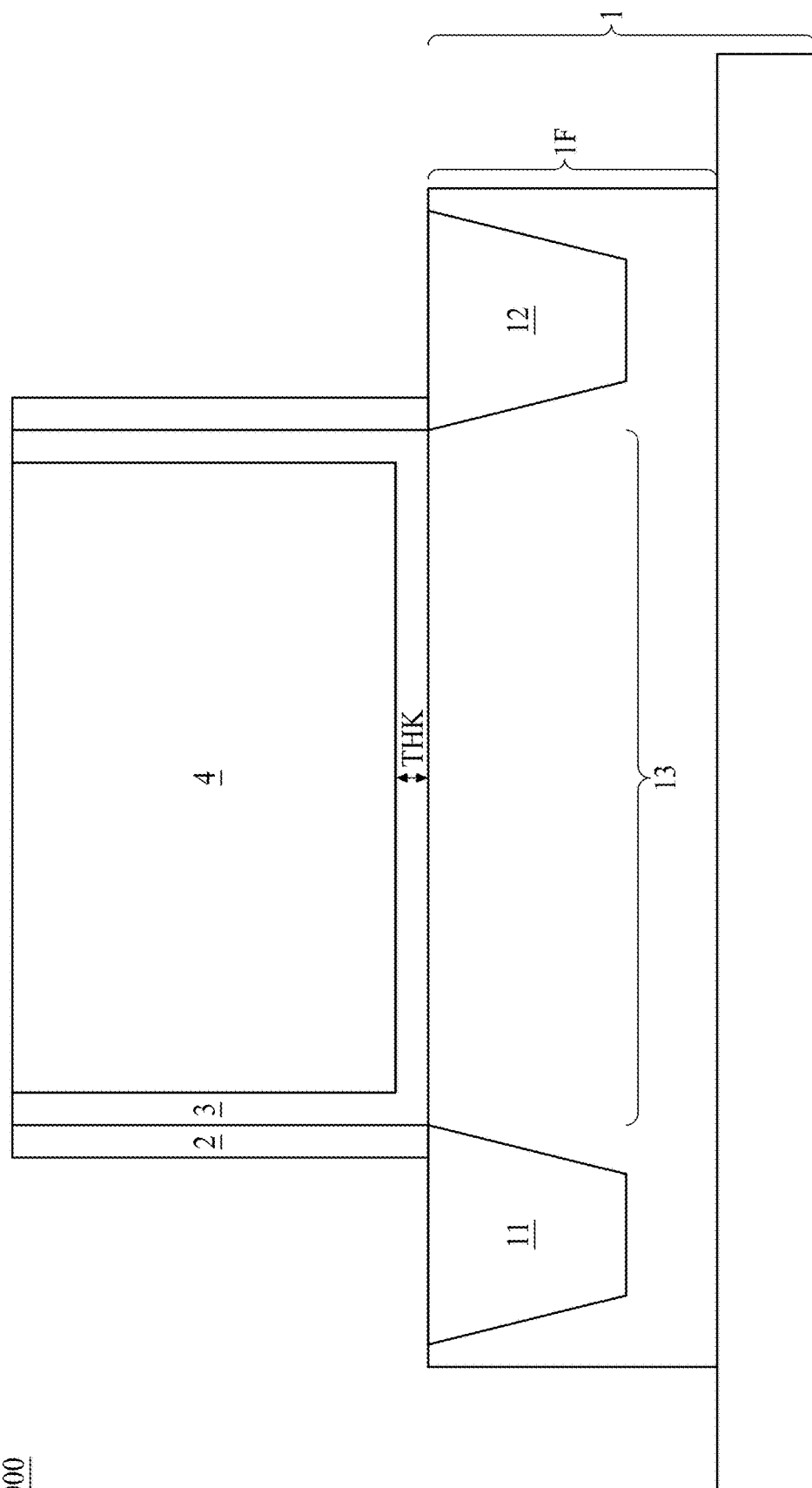
FIG. 1 is a cross sectional view of a semiconductor structure, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

One of the issues of fabricating a transistor is that, strain introduced in channel may loss during fabrication operations. The loss of strain may reduce carrier mobility and degrade device performance. Or, under some circumstances, the strain may need to be adjusted based on certain applications. For example, the strain may be adjusted under the consideration of carrier mobility and leakage mobility. Being able to adjust the strain after fabrication operation (such as after forming metal gate layer) may provide flexibility of configuration design and optimize device performance.

The present disclosure provides semiconductor structures (such as MOSFET, or fin field effect transistor) and method of fabricating semiconductor structures. Specifically, by incorporating a ferroelectric layer or piezoelectric layer into semiconductor structures, the strain in the channel region of the semiconductor structures can be adjusted by applying a bias voltage.

In the present disclosure, the term "ferroelectricity" can be referred to a characteristic of certain materials that have a spontaneous electric polarization that can be reversed by the application of an external electric field. In the present disclosure, the term "hafnium oxide" may be referred to $HfO_2$, or alternatively, other $HfO_x$.

Referring to FIG. 1, FIG. 1 is a cross sectional view of a semiconductor structure, according to some embodiments of the present disclosure. The semiconductor structure 1000 includes a substrate 1 including a fin 1F, source/drain regions 11/12 in the fin 1F of the substrate 1, a channel region 13 in the fin 1F of the substrate 1 between and defined by the source/drain regions 11/12, a metal gate layer 4 over the channel region 13, a spacer 2 at two opposite sides of the metal gate layer 4, and a ferroelectric layer 3 between the metal gate layer 4 and the spacer 2. In some embodiments, a portion of the ferroelectric layer 3 is exposed from a top surface of the metal gate layer 4 and a top surface of the spacer 2. In some of the embodiments, the spacer 2 is directly above the source/drain regions 11/12. Z-direction is perpendicular to a surface of the substrate 1, the metal gate layer 4 extends along y-direction, and x-direction is perpendicular to the y-direction and the z-direction. In some embodiments, x-direction is a direction from source region 11 to drain region 12, or vice versa.

The substrate 1 may be silicon, silicon germanium, germanium, silicon carbide, gallium arsenide, and the like. The substrate 1 may further be a bulk material, semiconductor on insulator (SOI), or the like. Source/drain regions 11/12 may be doped according to the conductivity type of the device, such as by phosphorous, arsenic, boron, or the like, and may utilize any suitable doping profile.

The ferroelectric layer 3 at least interposes between the channel region 13 and a bottom surface of the metal gate layer 4. The ferroelectric layer 3 may further extend and continuously spacing between an outer sidewall of the metal gate layer 4 and an inner sidewall of the spacer 2 (that is, having a U-shaped profile). In some embodiments, the ferroelectric layer 3 includes a ferroelectric material, for example, hafnium oxide-based material. In some embodiments, the hafnium oxide-based material may be, but not limited to, $HfO_2$, $HfO_2$ doped with one of the dopant of silicon (Si), nitrogen (N), lanthanum (La), aluminum (Al), yttrium (Y), zirconium (Zr), or the like. In some embodiments, ranges of the dopant concentration of the aforesaid dopants can be: Si in a range from about 3% to about 7%, N in a range from about 3% to about 5%, La in a range from about 5% to about 10%, Al in a range from about 3% to about 7%, Y from about 3% to about 7%, Zr from about 40% to about 60%. The aforesaid dopant concentration may stabilize and/or optimize the ferroelectricity of the ferroelectric layer 3.

In some alternative embodiments, an additional interfacial oxide layer (not shown in FIG. 1) is between the metal gate layer 4 and the ferroelectric layer 3. In some alternative embodiments, an additional high-k material is between the ferroelectric layer 3 and the metal gate layer 4. In some alternative embodiments, an additional high-k material is between the ferroelectric layer 3 and the spacer 2 or the substrate 1. In some alternative embodiments, an additional dielectric layer is adjacent to the metal gate layer 4 and coupled to the ferroelectric layer 3 to further enhance the ferroelectricity by coupling effect. In some alternative embodiments, an additional dielectric layer is adjacent to the gate oxide layer and coupled to the ferroelectric layer 3 to further enhance the ferroelectricity by coupling effect.

Figure 2:
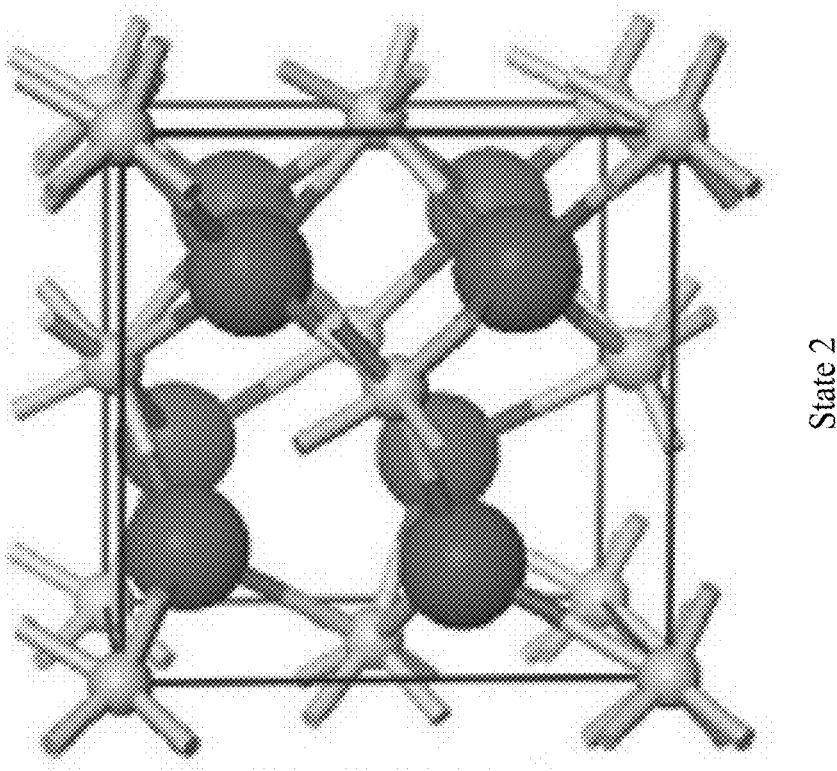
FIG. 2 is a schematic drawing showing two states of a unit lattice in a ferroelectric layer, according to some embodiments of the present disclosure.
Figure 2:
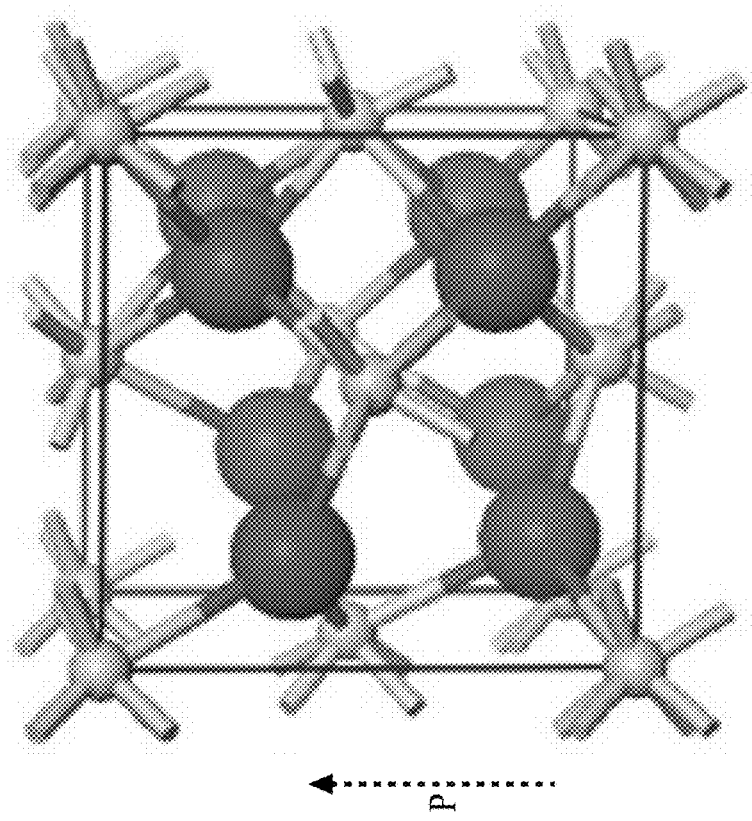
Figure 3A:
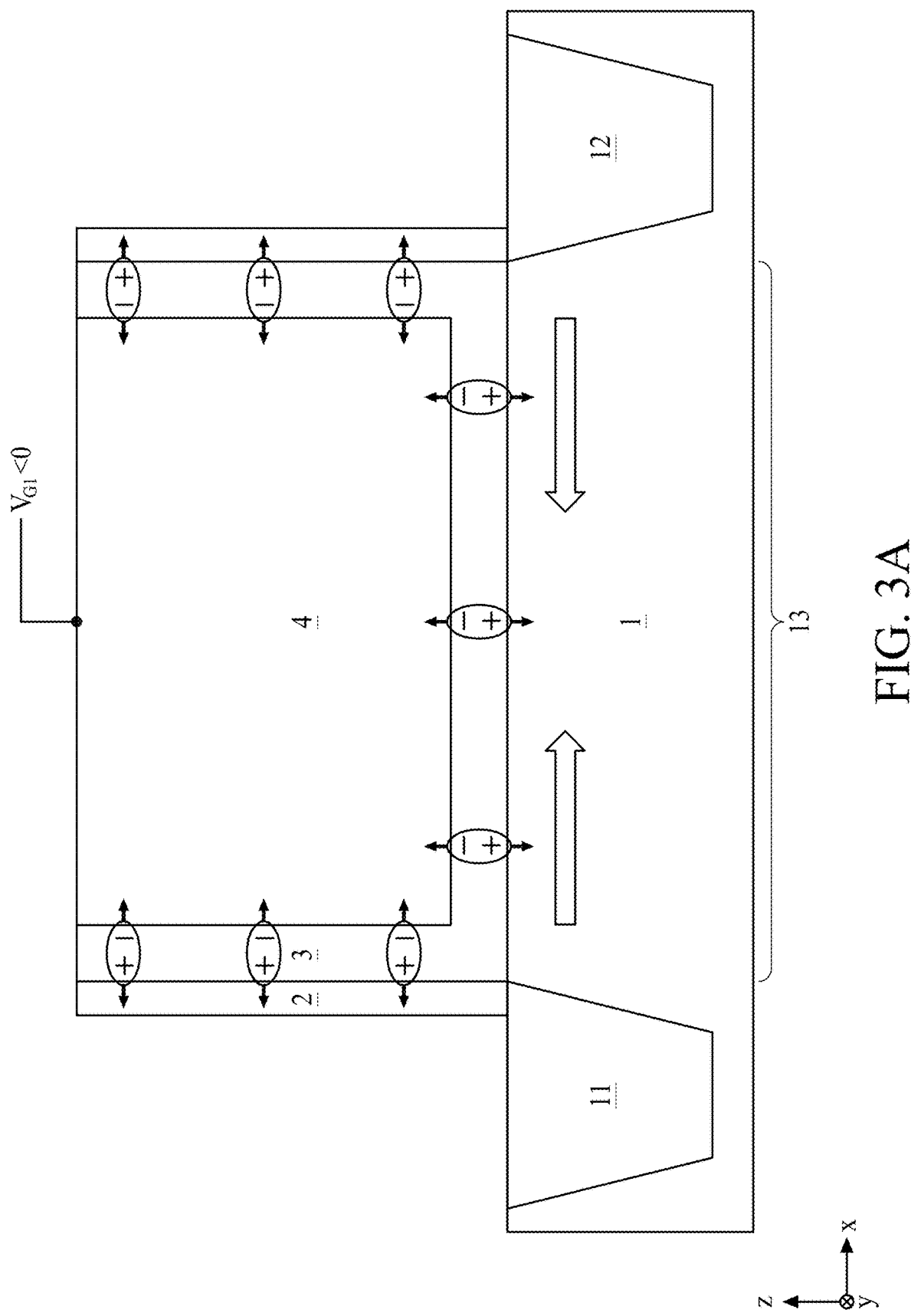
FIG. 3A is a schematic drawing showing a direction of strain generated in channel of a semiconductor structure, according to some embodiments of the present disclosure.
Figure 3B:
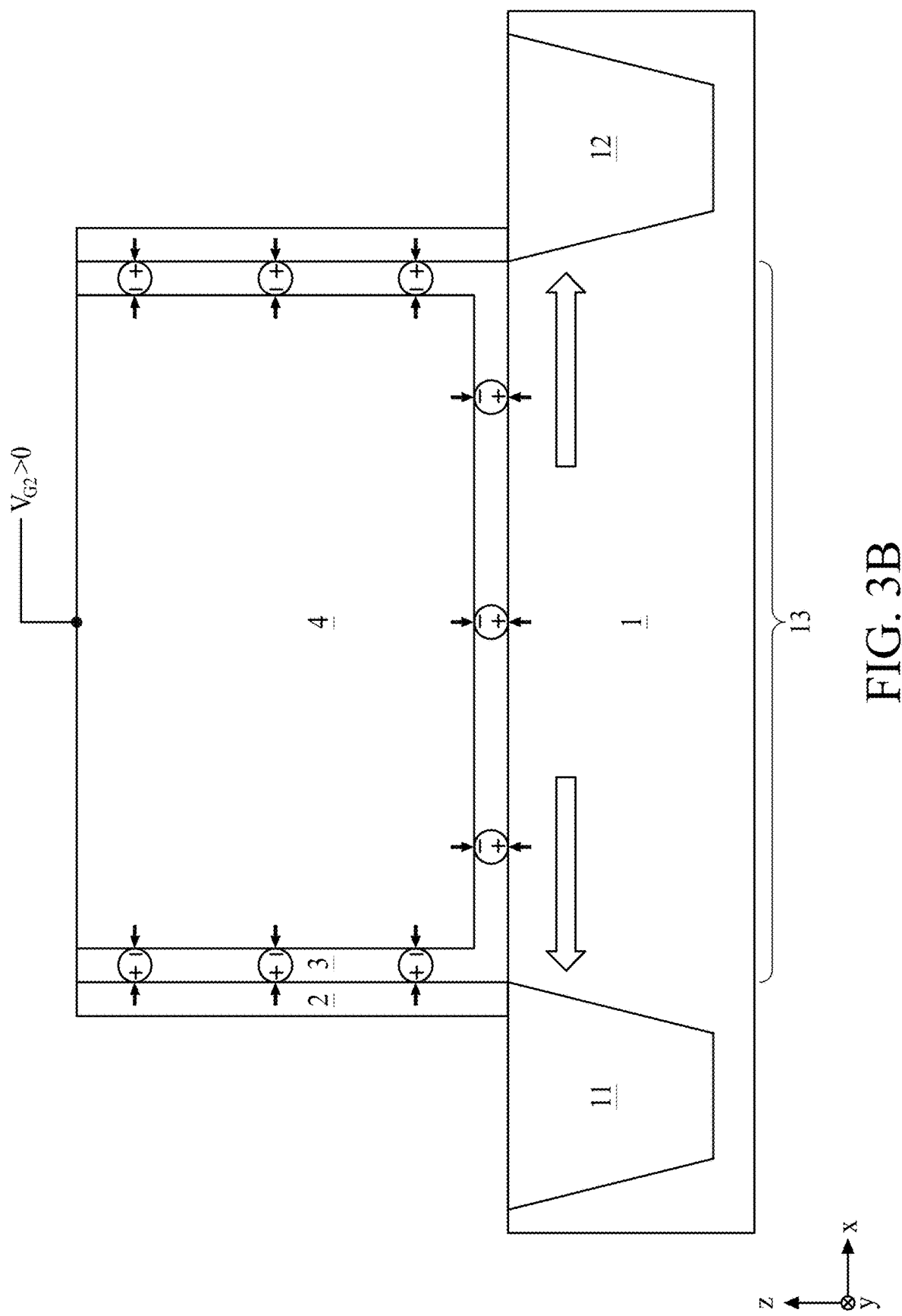
FIG. 3B is a schematic drawing showing a direction of strain generated in channel of a semiconductor structure, according to some embodiments of the present disclosure.

Referring to FIG. 2, FIG. 3A and FIG. 3B, FIG. 2 is a schematic drawing showing two states of a unit lattice in a ferroelectric layer, FIG. 3A is a schematic drawing showing a direction of strain generated in channel of a semiconductor structure, and FIG. 3B is a schematic drawing showing a direction of strain generated in channel of a semiconductor structure, according to some embodiments of the present disclosure. The ferroelectric layer 3 is configured to cause a tensile strain or compression strain in the channel region 13. A ferroelectric material of the ferroelectric layer 3 possesses at least two different polarization states, such as state 1 and state 2 as shown in FIG. 2. That is, under different condition of an electric field applied on the ferroelectric layer 3, the microstructure changes accordingly. Such effect allows the ferroelectric layer 3 to deform, such as expand or contract, depend on the electric field applied thereto and thereby causes a change in the strain in channel region 13. As shown in FIG. 3A, when the voltage applied to the metal gate layer 4 is applied with a first electric field $V_{G1}$, which may be negative (<0) or alternatively less than a threshold value (Vt, which is a voltage value for which the ferroelectric layer 3 converts from one state to another state, wherein the value is based on a specific type of the ferroelectric material), the ferroelectric layer 3 may expand and thereby inducing a compression strain in the channel 13 to counterbalance the expansion of the ferroelectric layer 3. In some embodiments, the expansion of the ferroelectric layer 3 may cause a uniaxial compression strain, e.g. in x-direction. In some other embodiments, the expansion of the ferroelectric layer 3 may cause an in-plane biaxial compression strain, e.g. in x- and y-direction. Such technique can especially be utilized in p-type device (such as p-MOSFET), which is often favorable when the channel region 13 has greater compression from the aspects of device performance.

As shown in FIG. 3B, when the voltage applied to the metal gate layer 4 is applied with a second electric field $V_{G2}$, which may be positive (>0) or alternatively greater than a threshold value (Vt, which is a voltage value for which the ferroelectric layer 3 converts from one state to another state, wherein the value is based on a specific type of the ferroelectric material), the ferroelectric layer 3 may contract and thereby inducing a tensile strain in the channel 13 to counterbalance the contraction of the ferroelectric layer 3. In some embodiments, the contraction of the ferroelectric layer 3 may cause a uniaxial tensile strain, e.g. in x-direction. In some other embodiments, the expansion of the ferroelectric layer 3 may cause an in-plane biaxial tensile strain, e.g. in x- and y-direction. Such technique can especially be utilized in n-type device (such as n-MOSFET), which is often favorable when the channel region 13 has greater tensile from the aspects of device performance.

In some embodiments, the ferroelectric layer 3 is a high-k material that can be utilized as a gate dielectric. In a comparative embodiment of a device having a gate oxide layer with a thickness greater than 10 nm between a metal gate layer and a channel region, the cost is relatively high and the throughput is not adequate. In some embodiments, the ferroelectric layer 3 is in direct contact with the substrate 1. In some other embodiments, an interfacial oxide layer having a thickness less than 10 nm is spacing between the ferroelectric layer 3 and the channel region 13.

The ferroelectric layer 3 may include a material that is able to deform in accordance with an applied electrical field and has high-k property thus can serve as a gate dielectric. As previously discussed, hafnium oxide-based material, such as $HfO_2$, $HfO_2$ doped with one of the dopant of silicon (Si), nitrogen (N), lanthanum, (La), aluminum (Al), yttrium (Y), zirconium (Zr), or the like, can be a material of the ferroelectric layer 3. Herein, ranges of the dopant concentration of the aforesaid dopants can be: Si in a range from about 3% to about 7%, N in a range from about 3% to about 5%, La in a range from about 5% to about 10%, Al in a range from about 3% to about 7%, Y from about 3% to about 7%, Zr from about 40% to about 60%. The aforesaid dopant concentration may stabilize and/or optimize the ferroelectricity of the ferroelectric layer 3.

It should be noted that hafnium oxide-based material possesses are larger bandgap (about 6 eV) that may help reducing gate leakage and lower dielectric constant ($\varepsilon_r$ in a range from about 30 to about 40) which may cause less phonon scattering effect on channel region 13. In some embodiments, a thickness THK of the ferroelectric layer 3 is in a range from about 15 Angstrom to about 100 Angstrom. When the thickness THK of the ferroelectric layer 3 is less than 15 Angstrom, the ferroelectric layer 3 may not be able to effectively reduce leakage current, considering the equivalent oxide thickness (EOT). Furthermore, in order to achieve enough deformation to generate tensile/compression strain in channel region 13, the thickness THK of the ferroelectric layer 3 is greater than 15 Angstrom. The thickness THK of the ferroelectric layer 3 is less than 100 Angstrom to achieve the purpose of minimizing the size of the device 1000. It should also be noted that, as will be subsequently discussed in FIG. 6C to FIG. 6F, since hafnium oxide-based material can be formed by atomic layer deposition (ALD) operation, it is feasible to form a ferroelectric layer 3 having a thickness less than 100 nm between the spacer 2.

Figure 4A:
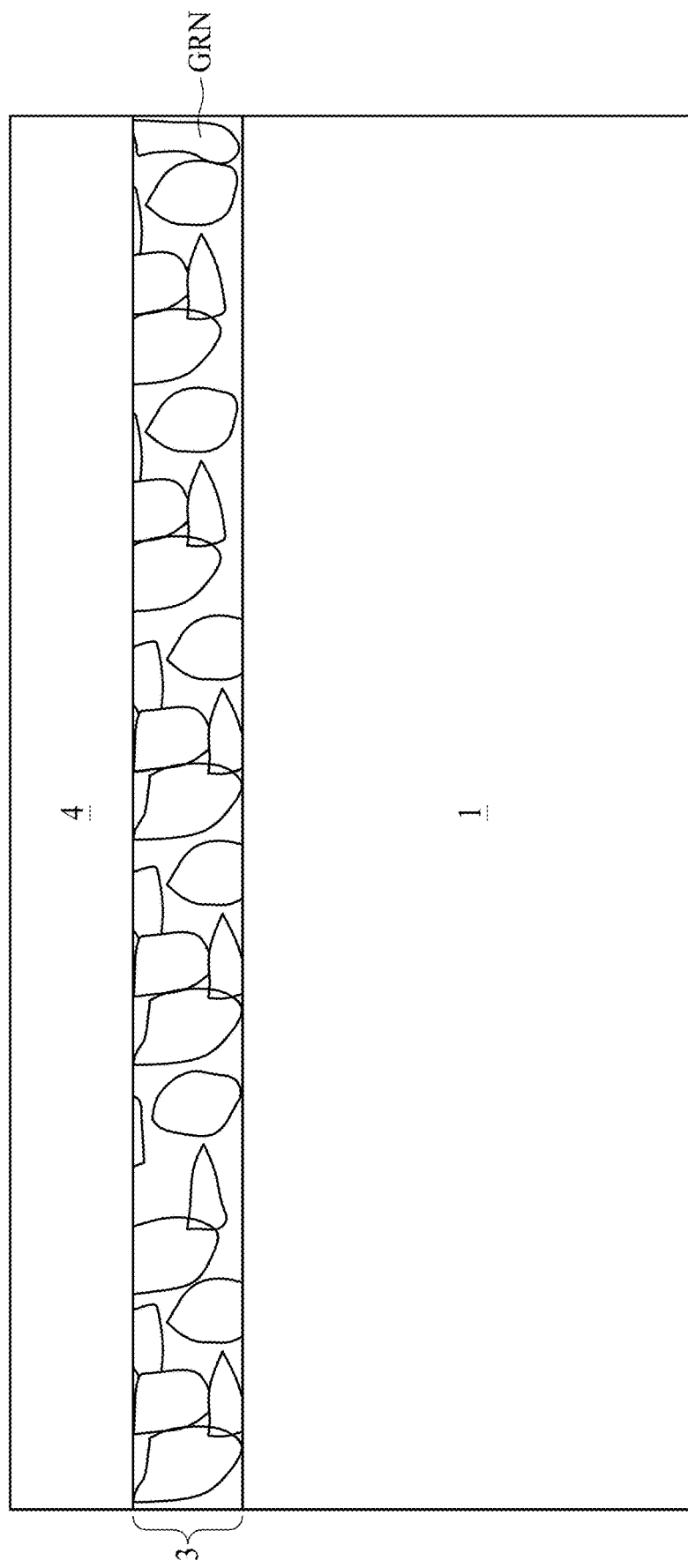
FIG. 4A is a partially enlarged cross sectional view of a ferroelectric layer of a semiconductor structure, according to some embodiments of the present disclosure.
Figure 4B:
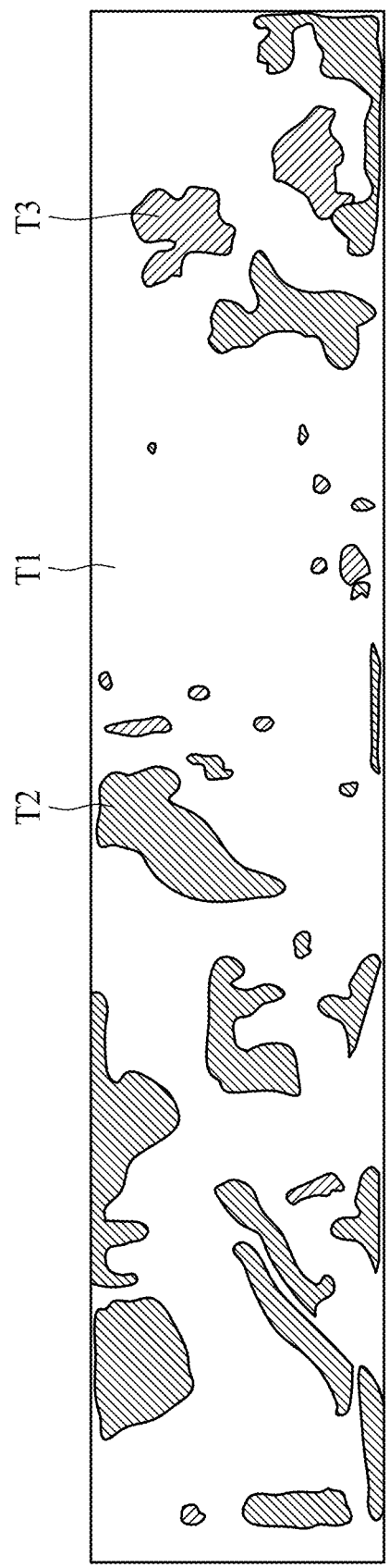
FIG. 4B is a cross sectional view of a ferroelectric layer of a semiconductor structure, according to some embodiments of the present disclosure.
Figure 4C:
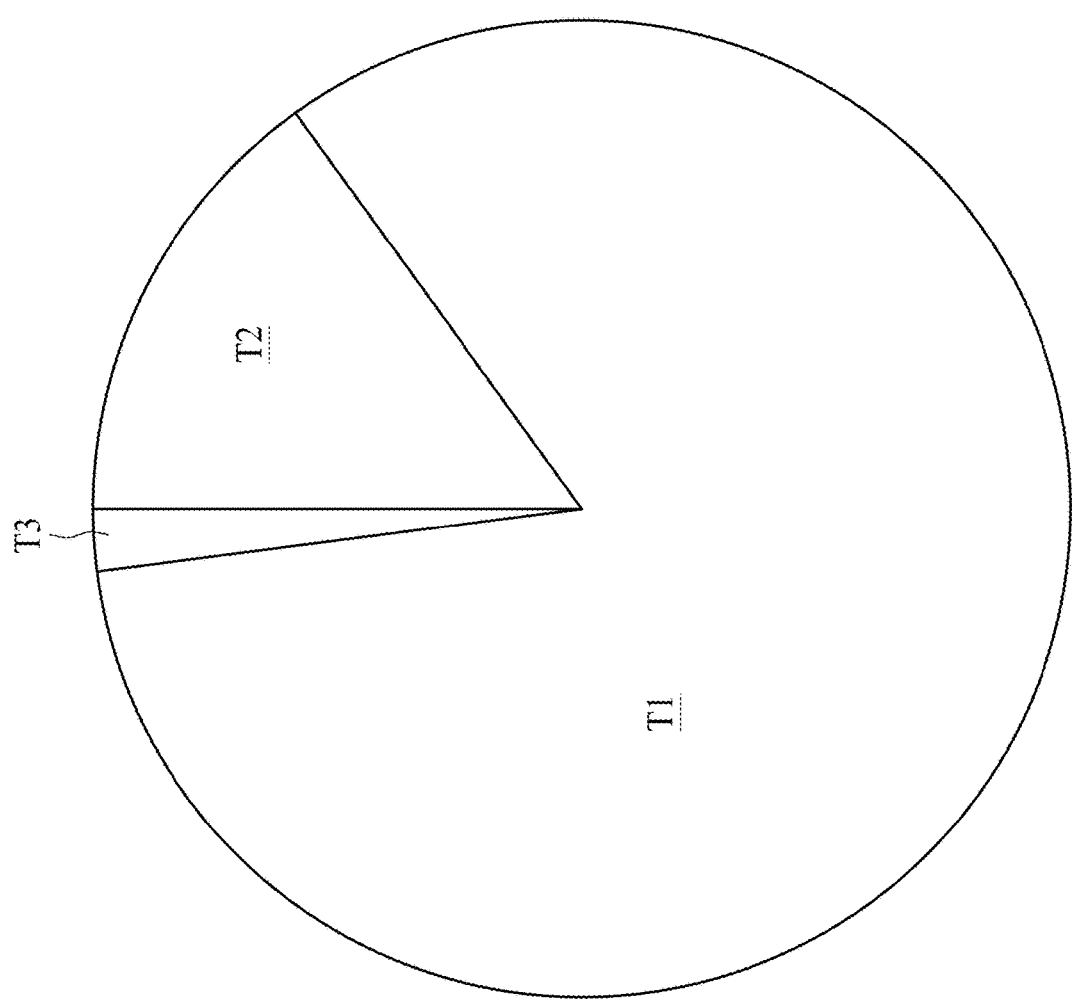
FIG. 4C is pie chart showing relative proportions of crystalline states in the ferroelectric layer of FIG. 4B, according to some embodiments of the present disclosure.

Referring to FIG. 4A to FIG. 4C, FIG. 4A is a partially enlarged cross sectional view of a ferroelectric layer of a semiconductor structure, FIG. 4B is a cross sectional view of a ferroelectric layer of a semiconductor structure, FIG. 4C is pie chart showing relative proportions of crystalline states in the ferroelectric layer of FIG. 4B, according to some embodiments of the present disclosure. In some embodiments, a material of the ferroelectric layer 3 is crystallized and includes a plurality of crystal grains GRN. In some embodiments, a material may have various states presenting different crystalline structures, which may be represented by different Hermann-Mauguin notation. In order to have a ferroelectric layer 3 with adequate/stronger ferroelectricity, a ratio of a volume of a specific phase of the ferroelectric layer 3 over the total volume of the ferroelectric layer 3 may be greater than a value. In the case of ferroelectric layer 3 includes hafnium oxide-based material, the hafnium oxide shows greater ferroelectricity in orthorhombic phase (e.g. Orthorhombic-29 $Pca2_1$), which is denoted as "the first phase T1" in FIG. 4B to FIG. 4C. Whereas other phases of hafnium oxide may show less or none ferroelectricity, for example, monoclinic phase (e.g. Monoclinic-14 $P2_1/c$) and tetragonal phase (e.g. Tetragonal-137 $P4_2/nmc$), respectively denoted as "the second phase T2" and "the third phase T3" in FIG. 4B to FIG. 4C.

The ferroelectric layer 3 may include a first portion of hafnium oxide-based material of first phase T1 (e.g. orthorhombic phase), a second portion of hafnium oxide-based material of second phase T2 (e.g. monoclinic phase), and a third portion of hafnium oxide-based material of third phase T3 (e.g. tetragonal phase). In order improve the ferroelectricity of the ferroelectric layer 3, the hafnium oxide-based material of first phase T1 possess a majority of volume in ferroelectric layer 3, such as over 50%. That is, a volume of the first portion (the first phase T1) is greater than a total volume of the second portion (the second phase T2) and the third portion (the third phase T3). An example of a cross sectional view of a ferroelectric layer 3 is shown in FIG. 4B, and a proportion of each phases in the cross section view of FIG. 4B is demonstrated in FIG. 4C. In some embodiments, by having a ferroelectric layer 3 having over 50% of hafnium oxide-based material of orthorhombic phase, the ferroelectricity of the ferroelectric layer 3 can be improved. For the example shown in FIG. 4B and FIG. 4C, each of the proportion of a volume of the first portion (the first phase T1), a volume of the second portion (the second phase T2) and the third portion (the third phase T3) among total volume of the ferroelectric layer 3 is about 83%, 15%, 2% (but the present disclosure is not limited thereto).

Alternatively in some other embodiments, piezoelectric materials, such as zinc oxide (ZnO), Barium titanate (BTO), lead zirconate titanate (PZT), anti-ferroelectric materials, or the like, are disposed to continuously spacing the metal gate layer 4 from the substrate 1 and the spacer 2. The aforesaid materials may also be able to generate tensile/compression strain in channel region 13 by controlling a voltage applied thereto.

Figure 5A:
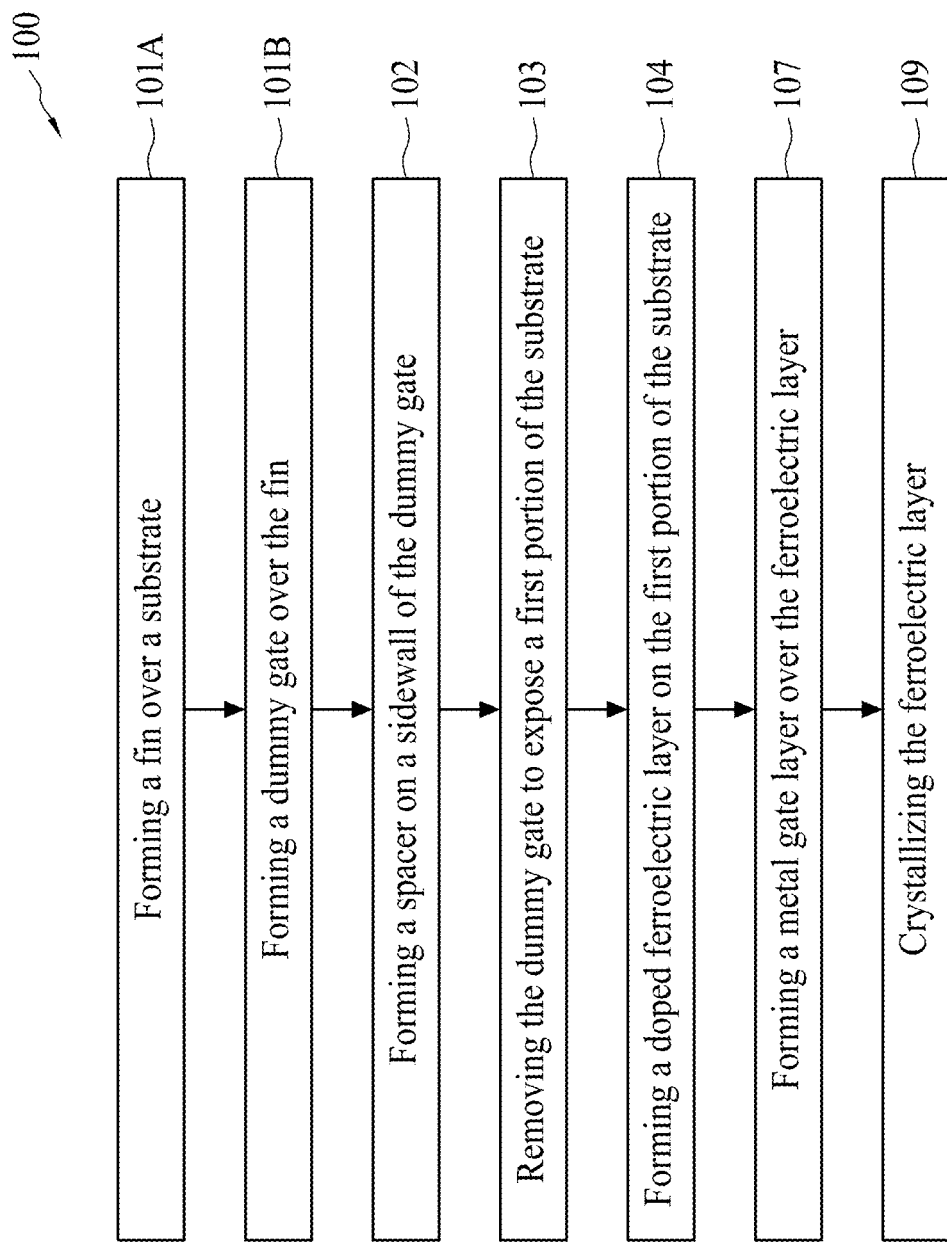
FIG. 5A shows a flow chart representing method of fabricating a semiconductor structure, in accordance with some embodiments of the present disclosure.

Referring to FIG. 5A, FIG. 5A shows a flow chart representing method of fabricating a semiconductor structure, in accordance with some embodiments of the present disclosure. The method 100 for fabricating a semiconductor structure includes forming a fin over a substrate (operation 101A, which can be referred to FIG. 6A), forming a dummy gate over the fin (operation 101B, which can be referred to FIG. 6A), forming a spacer on a sidewall of the dummy gate (operation 102, which can be referred to FIG. 6A), removing the dummy gate to expose a first portion of the substrate (operation 103, which can be referred to FIG. 6B), forming a doped ferroelectric layer on the first portion of the substrate (operation 103, which can be referred to FIG. 6C to FIG. 6F), forming a metal gate layer over the ferroelectric layer (operation 107, which can be referred to FIG. 6G), and crystallizing the ferroelectric layer (operation 109, which can be referred to FIG. 6H).

Figure 5B:
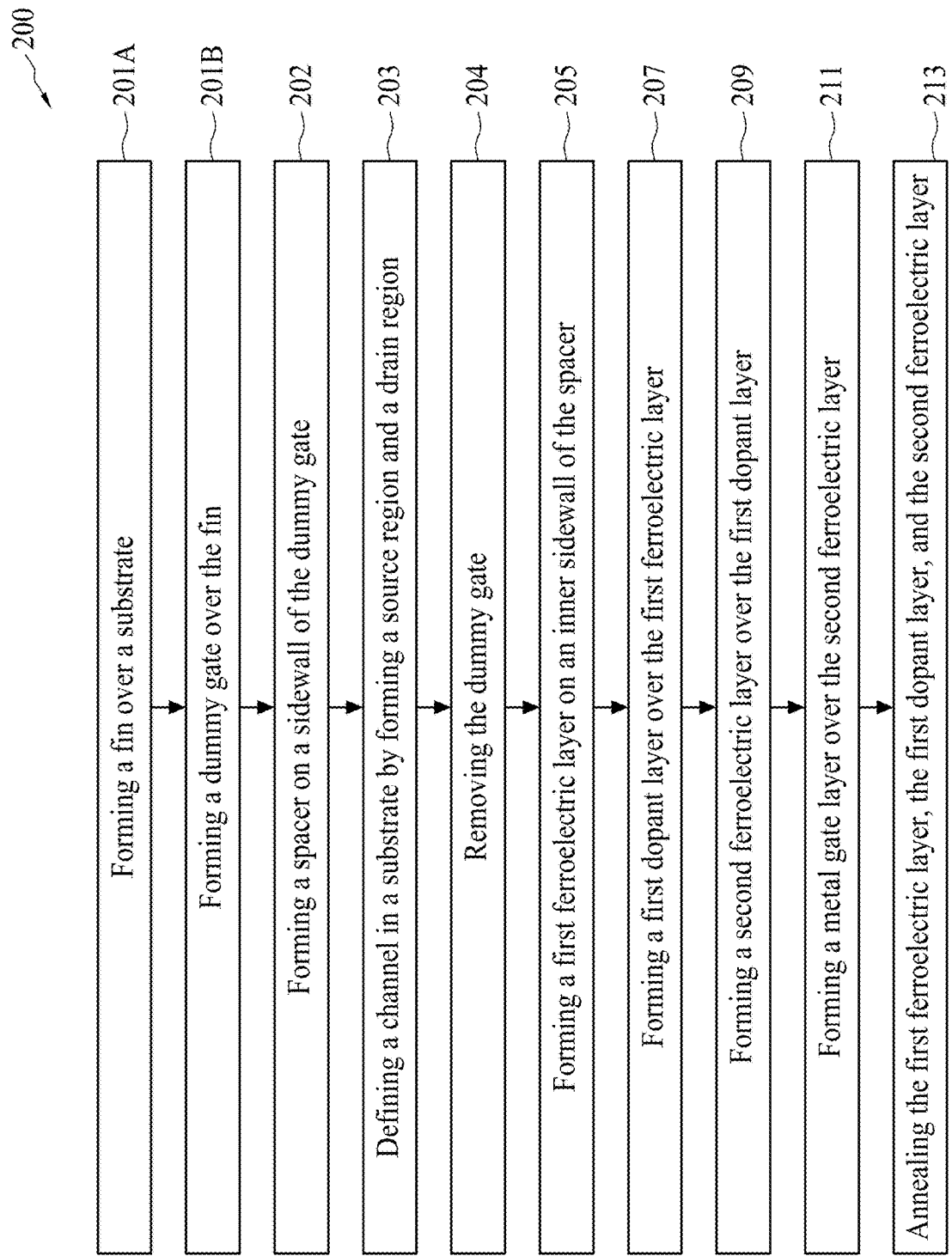
FIG. 5B shows a flow chart representing method of fabricating a semiconductor structure, in accordance with some embodiments of the present disclosure.

Referring to FIG. 5B, FIG. 5B shows a flow chart representing method of fabricating a semiconductor structure, in accordance with some embodiments of the present disclosure. The method 200 for fabricating a semiconductor structure includes forming a fin over a substrate (operation 201A, which can be referred to FIG. 6A), forming a dummy gate over the fin (operation 201B, which can be referred to FIG. 6A), forming a spacer on a sidewall of the dummy gate (operation 202, which can be referred to FIG. 6A), Defining a channel in a substrate by forming a source region and a drain region (operation 203, which can be referred to FIG. 6B), removing the dummy gate (operation 204, which can be referred to FIG. 6B), forming a first ferroelectric layer on an inner sidewall of the spacer (operation 205, which can be referred to FIG. 6C), forming a first dopant layer over the first ferroelectric layer (operation 207, which can be referred to FIG. 6D), forming a second ferroelectric layer over the first dopant layer (operation 209, which can be referred to FIG. 6E), forming a metal gate layer over the second ferroelectric layer (operation 211, which can be referred to FIG. 6G), and annealing the first ferroelectric layer, the first dopant layer, and the second ferroelectric layer (operation 213, which can be referred to FIG. 6H).

Figure 6A:
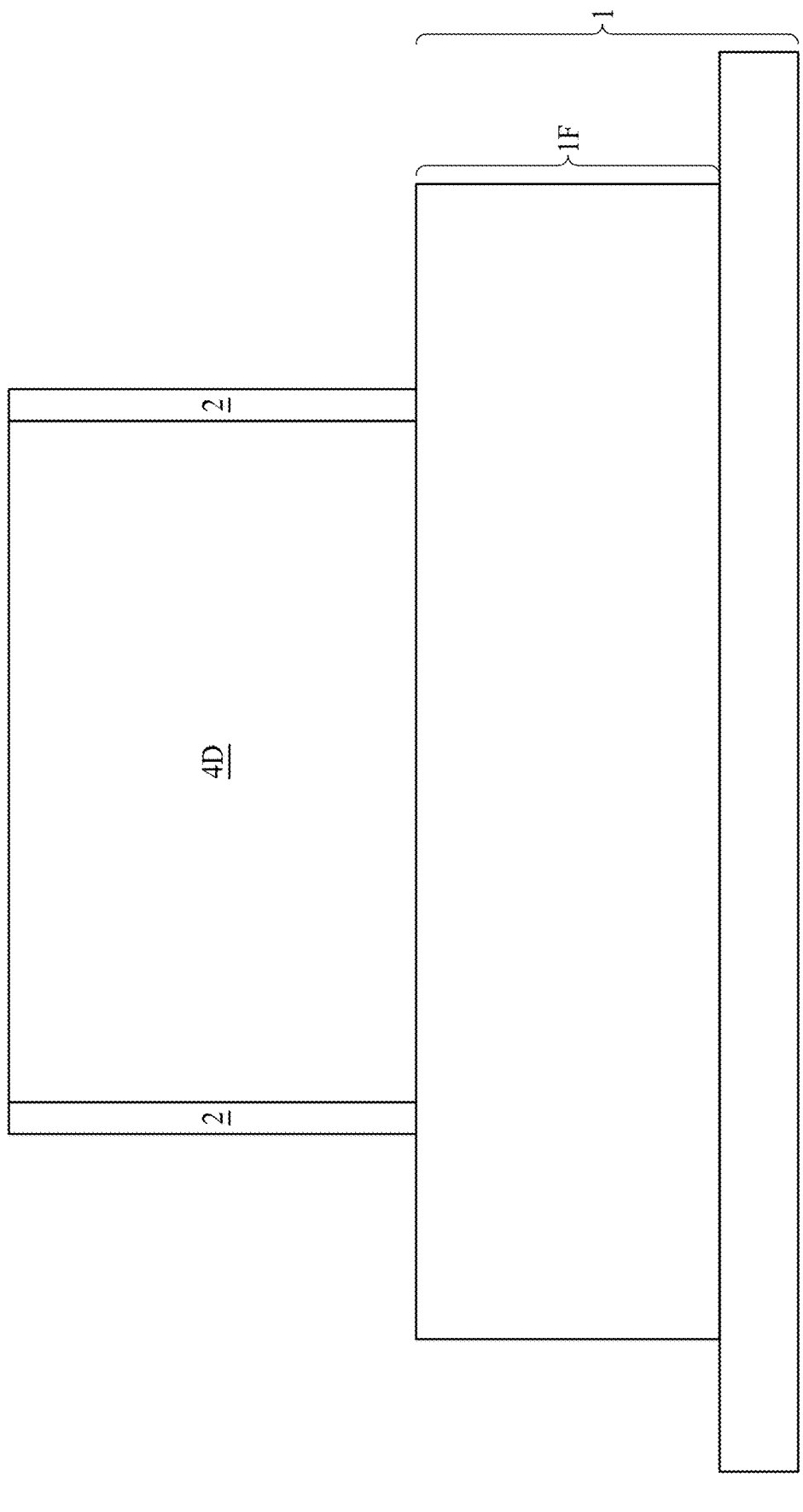
FIG. 6A to FIG. 6H are cross sectional views of a semiconductor structure during intermediate stages of manufacturing operations, according to some embodiments of the present disclosure.

Referring to FIG. 6A, FIG. 6A is a cross sectional view of a semiconductor structure during intermediate stages of manufacturing operations, according to some embodiments of the present disclosure. A fin 1F along x direction (shown in FIG. 6A) is formed over a substrate 1. A dummy gate 4D is formed over the fin 1F and extending in a direction orthogonal to the fins 1F (y direction shown in FIG. 6A). A spacer 2 is formed on a sidewall of the dummy gate 4D and over the fin 1F.

Figure 6B:
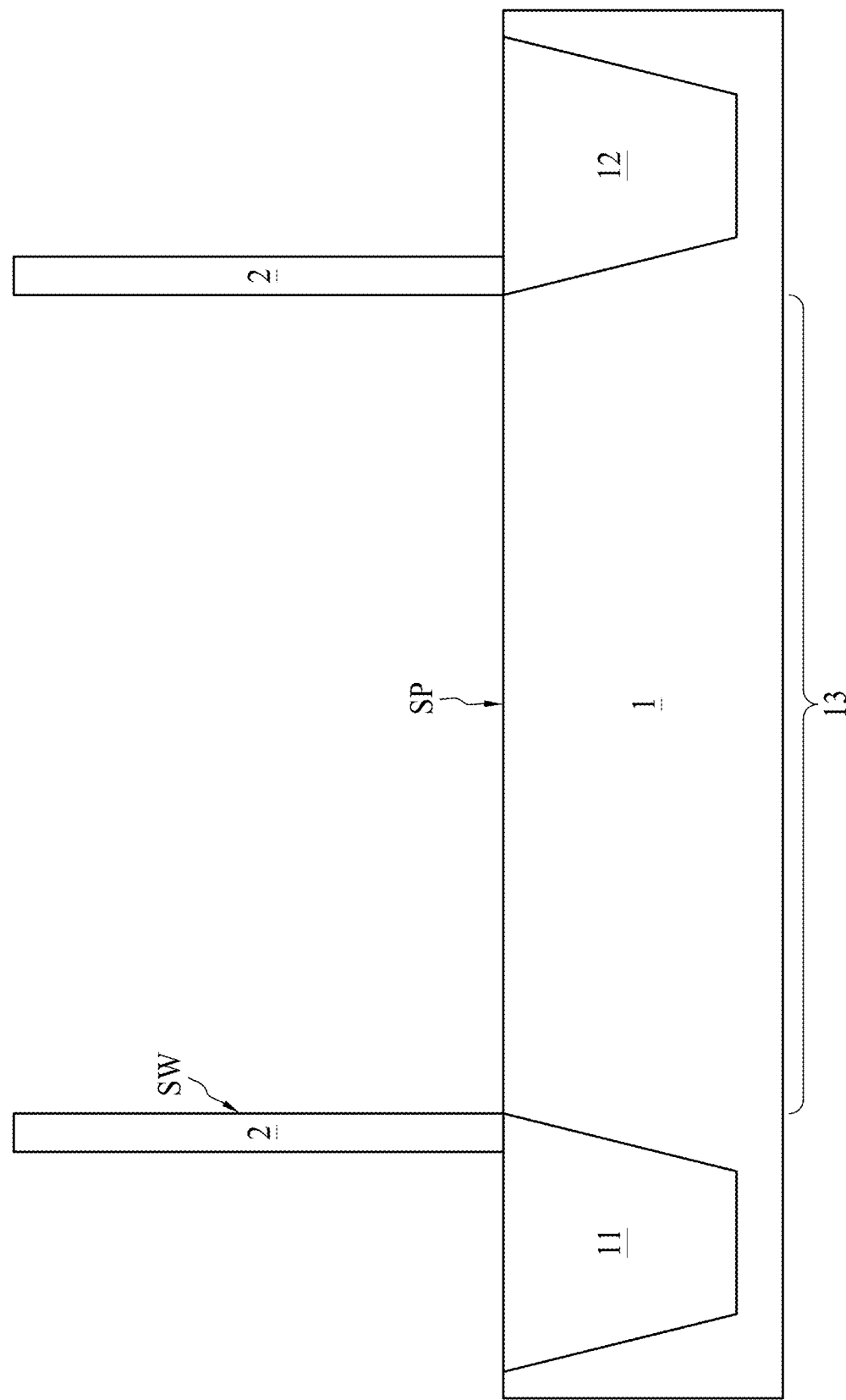

Referring to FIG. 6B, FIG. 6B is a cross sectional view of a semiconductor structure during intermediate stages of manufacturing operations, according to some embodiments of the present disclosure. A spacer 2 is formed over the fin 1F. A source region 11 and a drain region 12 are formed partially embedded and/or partially protruding from a portion of the fin 11F proximal to two sides of the spacer 2. The dopant implanted in the source/drain region 11/12 may be in accordance with the type of device to be fabricated. The spacer 2 and the dummy gate 4D can be the self-aligned hard mask for the formation of the source region 11 and the drain region 12. A channel region 13 is thereby defined by the formed source/drain region 11/12. The dummy gate 4D is then removed to expose a first surface area SP of the channel region 13 and an inner sidewall SW of the spacer 2.

Figure 6C:
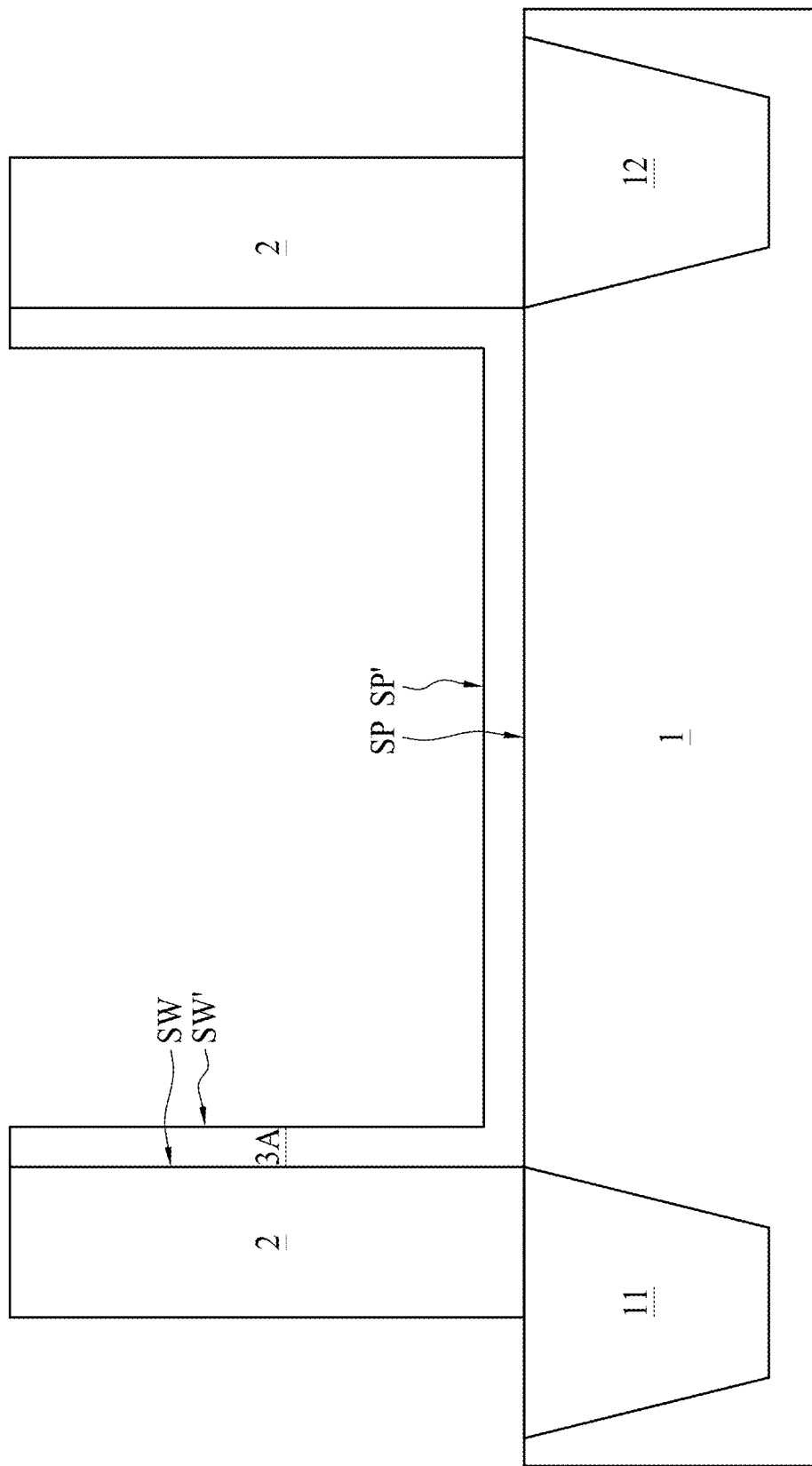

Referring to FIG. 6C, FIG. 6C is a cross sectional view of a semiconductor structure during intermediate stages of manufacturing operations, according to some embodiments of the present disclosure. A first ferroelectric layer 3A is formed over first surface area SP of the channel region 13 and further conforms to the inner sidewall SW of the spacer 2 (thus having a U-shaped profile). In some embodiments, the first ferroelectric layer 3A includes hafnium oxide, such as $HfO_2$, or the like. In some embodiments, the first ferroelectric layer 3A formed in this operation include amorphous $HfO_2$. The amorphous $HfO_2$ may be pure or undoped. In some embodiments, the first ferroelectric layer 3A is formed by in-situ atomic layer deposition (ALD) operation in order to form a first ferroelectric layer 3A with thinner thickness under improved thickness control (which may also be capable to form a layer having a thickness less than 10 nm).

Figure 6D:
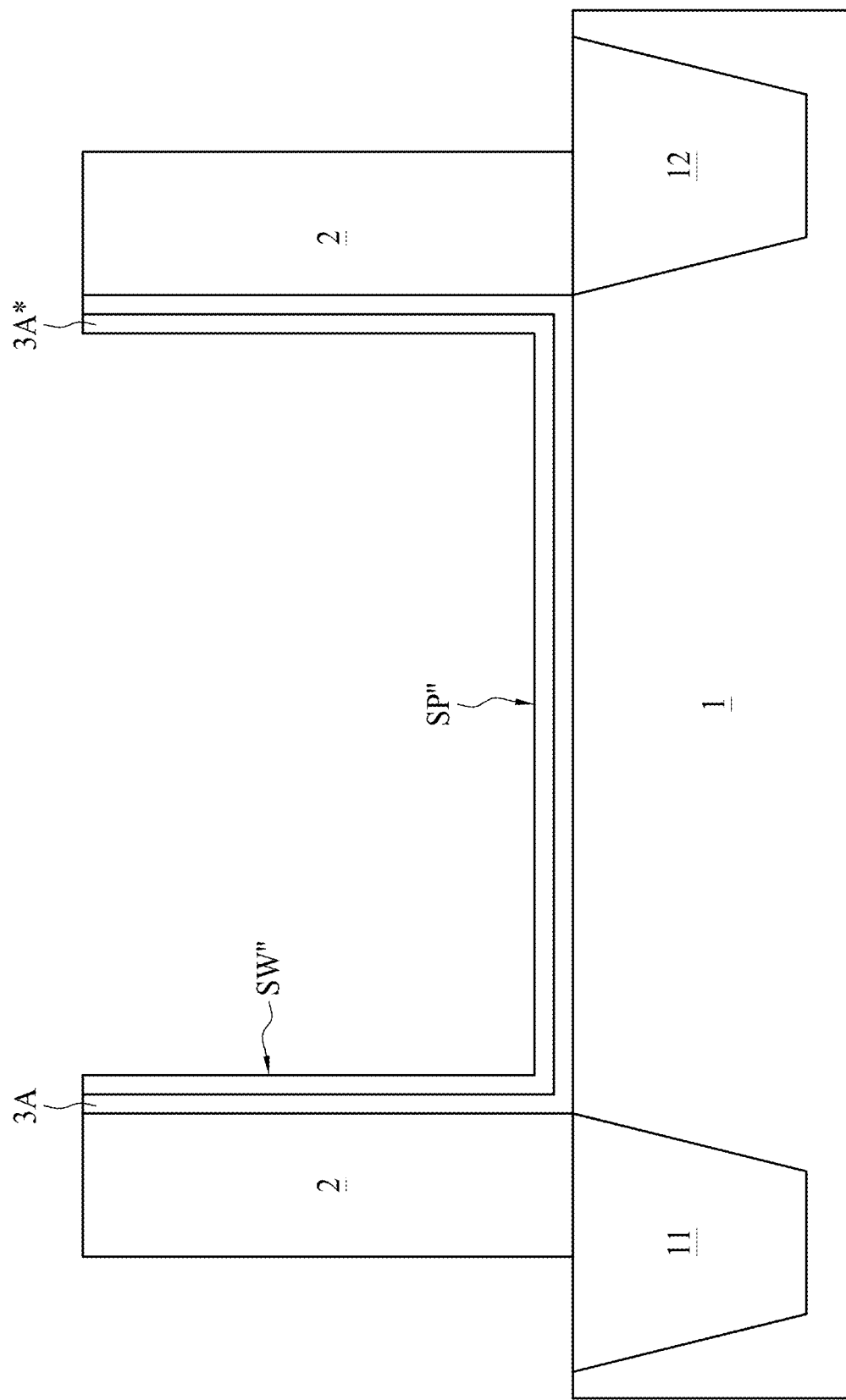
Figure 6E:
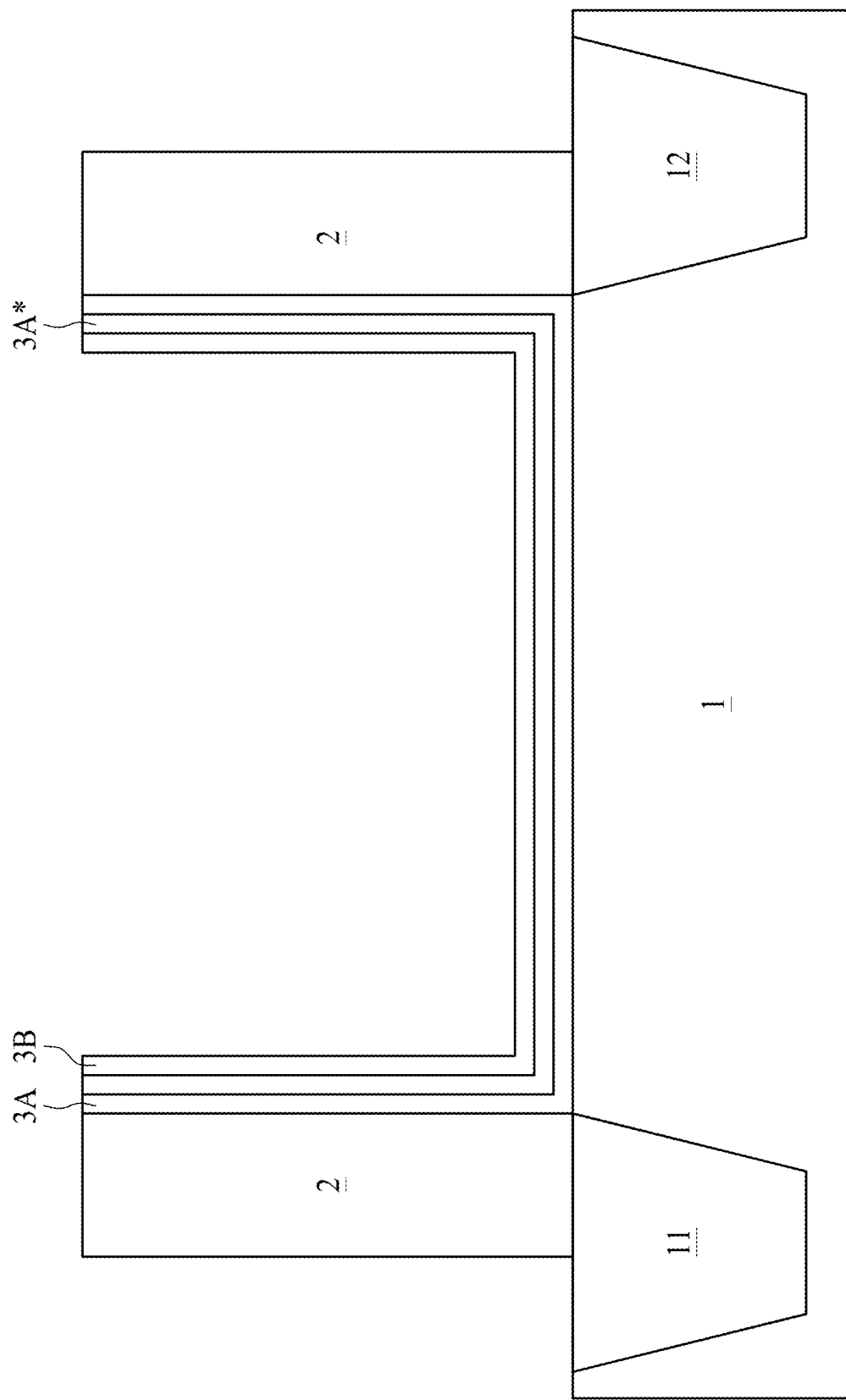
Figure 6F:
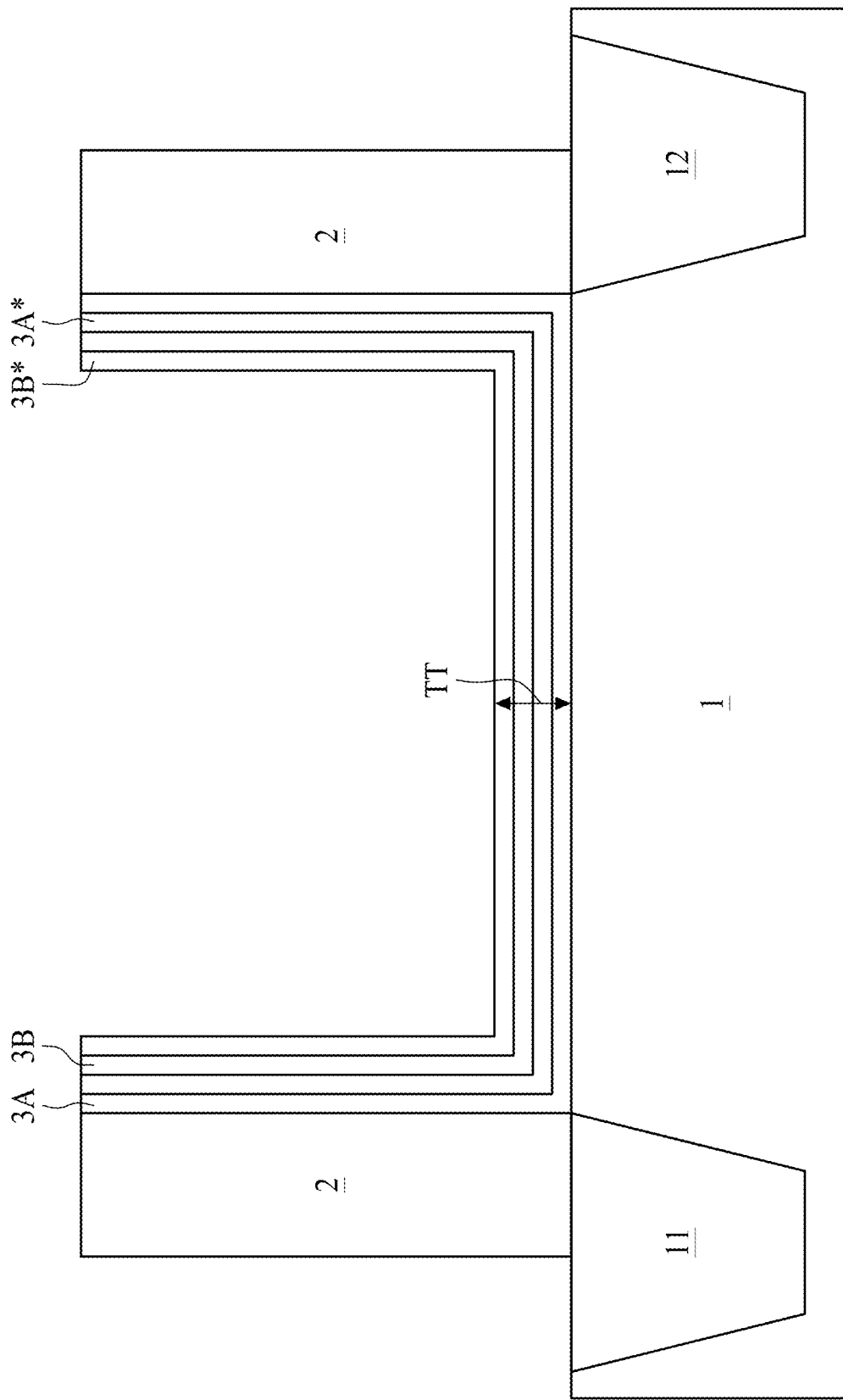

In the case of opting to have the ferroelectric layer 3 doped with dopant, the operations discussed in FIG. 6D to FIG. 6F can optionally be performed. (If the ferroelectric layer 3 would not be doped with dopant, a thickness of the first ferroelectric layer 3A is in a range from about 15 Angstrom to about 100 Angstrom) Referring to FIG. 6D, FIG. 6D is a cross sectional view of a semiconductor structure during intermediate stages of manufacturing operations, according to some embodiments of the present disclosure. A first dopant layer 3A* is formed over an exposed surface of the first ferroelectric layer 3A, wherein the exposed surface may include a bottom surface SP' and an inner sidewall SW' as shown in FIG. 6C, and a portion of the first dopant layer 3A* conforms to the inner sidewall SW' of the first ferroelectric layer 3A. The first dopant layer 3A* may include one of the dopant of silicon (Si), nitrogen (N), lanthanum, (La), aluminum (Al), yttrium (Y), zirconium (Zr), or the like. In some embodiments, the first dopant layer 3A* is formed by in-situ ALD operation in order to form a first dopant layer 3A* with thinner thickness under improved thickness control.

Referring to FIG. 6E, FIG. 6E is a cross sectional view of a semiconductor structure during intermediate stages of manufacturing operations, according to some embodiments of the present disclosure. A second ferroelectric layer 3B is formed over an exposed surface of the first dopant layer 3A*, wherein the exposed surface may include a bottom surface SP" and an inner sidewall SW" as shown in FIG. 6C, and a portion of the second ferroelectric layer 3B conforms to the inner sidewall SW' of the first dopant layer 3A*. In some embodiments, the first ferroelectric layer 3A includes hafnium oxide, such as $HfO_2$, or the like. In some embodiments, the second ferroelectric layer 3B formed in this operation include amorphous $HfO_2$. The amorphous $HfO_2$ may be pure or undoped. In some embodiments, the second ferroelectric layer 3B is formed by in-situ ALD operation in order to form a second ferroelectric layer 3B with thinner thickness under improved thickness control.

Referring to FIG. 6F, FIG. 6F is a cross sectional view of a semiconductor structure during intermediate stages of manufacturing operations, according to some embodiments of the present disclosure. Optionally, one or more dopant layers and/or ferroelectric layers can be formed in the manner similar to the previously discussed FIG. 6C to FIG. 6E, until a total thickness TT of the dopant layers and the ferroelectric layers is around a desired value. For example, a second dopant layer 3B* formed over an exposed surface of the second ferroelectric layer 3B, wherein the material of the second dopant layer 3B* may be identical to the first dopant layer 3A*, and may be formed by ALD operation. In some embodiments, the total thickness TT is in a range from about 15 Angstrom to about 100 Angstrom, as the criticality was previously discussed in FIG. 1 to FIG. 3B. Hereinafter every dopant layers and ferroelectric layers are collectively referred as a stack 3*, as denoted in FIG. 6G.

Figure 6G:
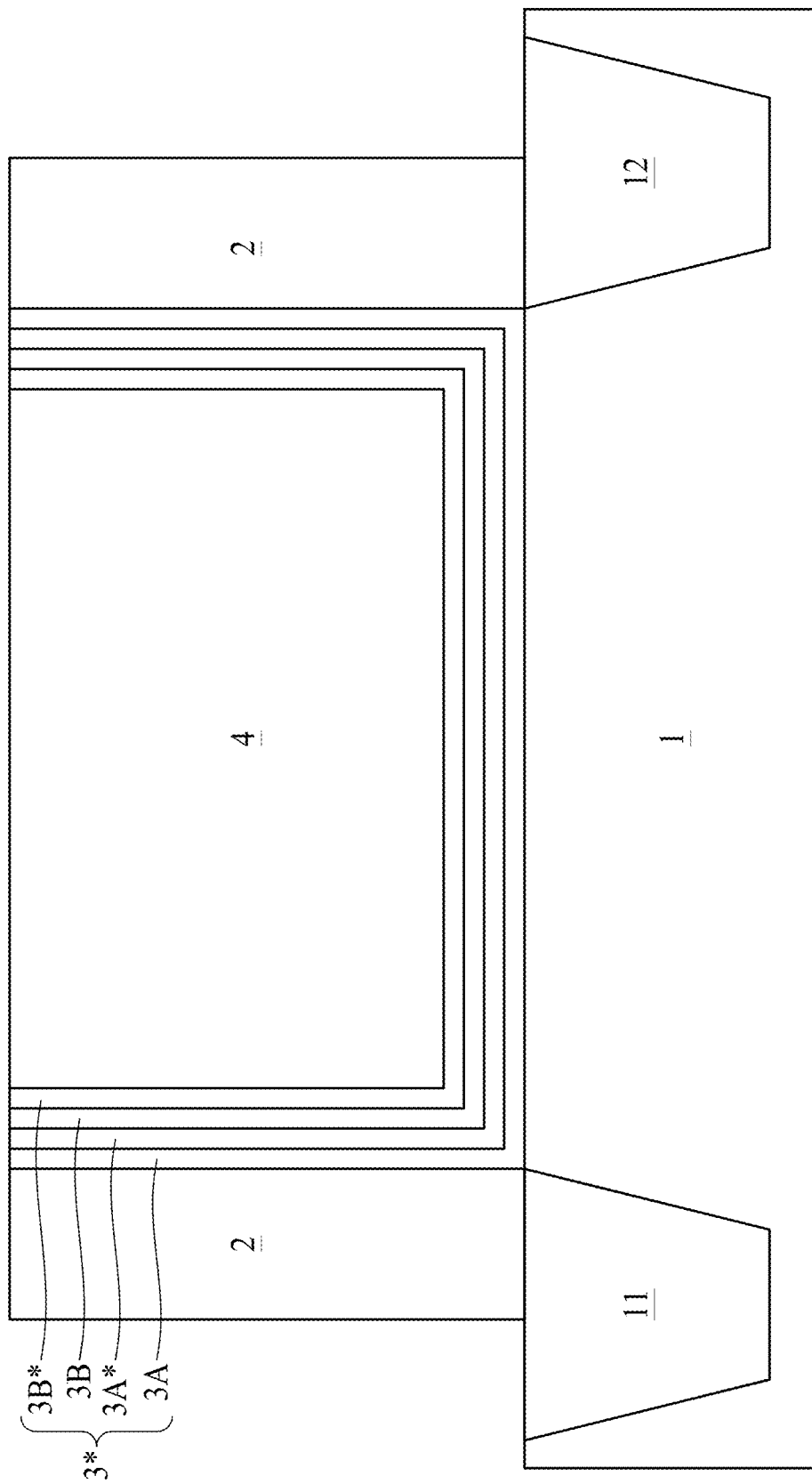

Referring to FIG. 6G, FIG. 6G is a cross sectional view of a semiconductor structure during intermediate stages of manufacturing operations, according to some embodiments of the present disclosure. A metal gate layer 4 is formed over the stack 3*, and the metal gate layer 4 is surrounded by the stack 3*. In some embodiments, the stack 3* continuously spaces between the spacer 2 and the metal gate layer 4. In some embodiments, a portion of the stack 3* is exposed from a top surface of the metal gate layer 4 and a top surface of the spacer 2.

Figure 6H:
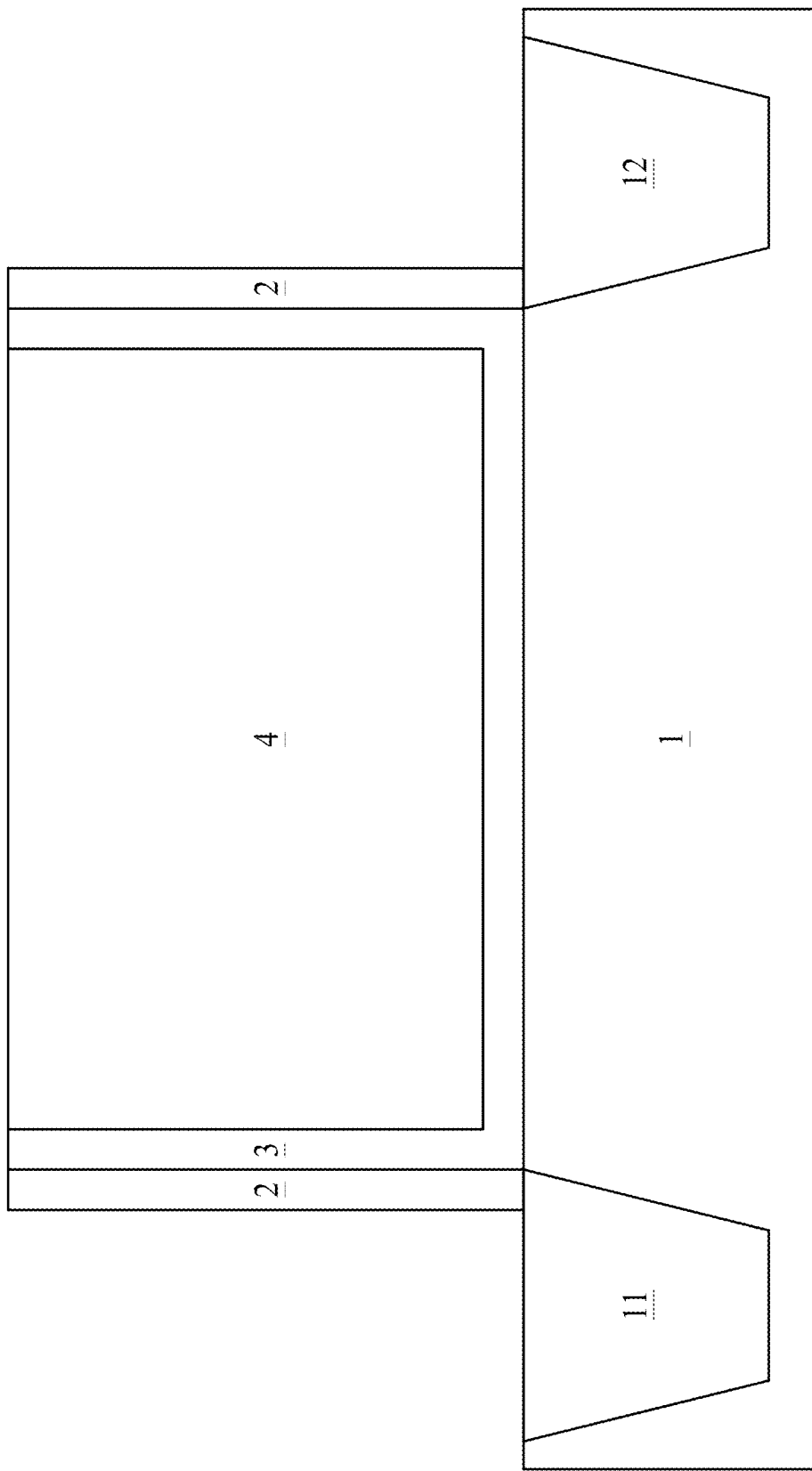

Referring to FIG. 6H, FIG. 6H is a cross sectional view of a semiconductor structure during intermediate stages of manufacturing operations, according to some embodiments of the present disclosure. The stack 3* (including the first ferroelectric layer 3A, the first dopant layer 3A*, the second ferroelectric layer 3B, et cetera) is annealed in order to crystalize the material of the ferroelectric layers and thereby forming ferroelectric layer 3. In the case of the ferroelectric layers includes hafnium oxide (such as HfO$_2$), the amorphous hafnium oxide may be converted into one or more different phases. For example, as previously discussed in FIG. 4A to FIG. 4C, the annealed stack 3* may be converted into one or more crystalized phases such as first phase T1 (e.g. orthorhombic phase), second phase T2 (e.g. monoclinic phase, such as Monoclinic-14 P2$_1$/c), and third phase T3 (e.g. tetragonal phase, such as tetragonal-137 P4$_2$/nmc). As previously discussed, a volume of HfO$_2$ of orthorhombic phase is greater than half of the total volume of the ferroelectric layer 3. In some embodiments, in order to form enough volume of HfO$_2$ of orthorhombic phase, a temperature of the annealing operation is in a range from about 650° C. to about 950° C.

Furthermore, by annealing the stack 3*, the dopant in the dopant layers 3A*, 3B* (et cetera) may be diffused into the ferroelectric layers 3A, 3B (et cetera). In the case of the dopant is one of silicon (Si), nitrogen (N), lanthanum (La), aluminum (Al), yttrium (Y), zirconium (Zr), ranges of the dopant concentration of the aforesaid dopants in the formed ferroelectric layer 3 after annealing operation can be the following: Si in a range from about 3% to about 7%, N in a range from about 3% to about 5%, La in a range from about 5% to about 10%, Al in a range from about 3% to about 7%, Y from about 3% to about 7%, Zr from about 40% to about 60%.

Figure 7A:
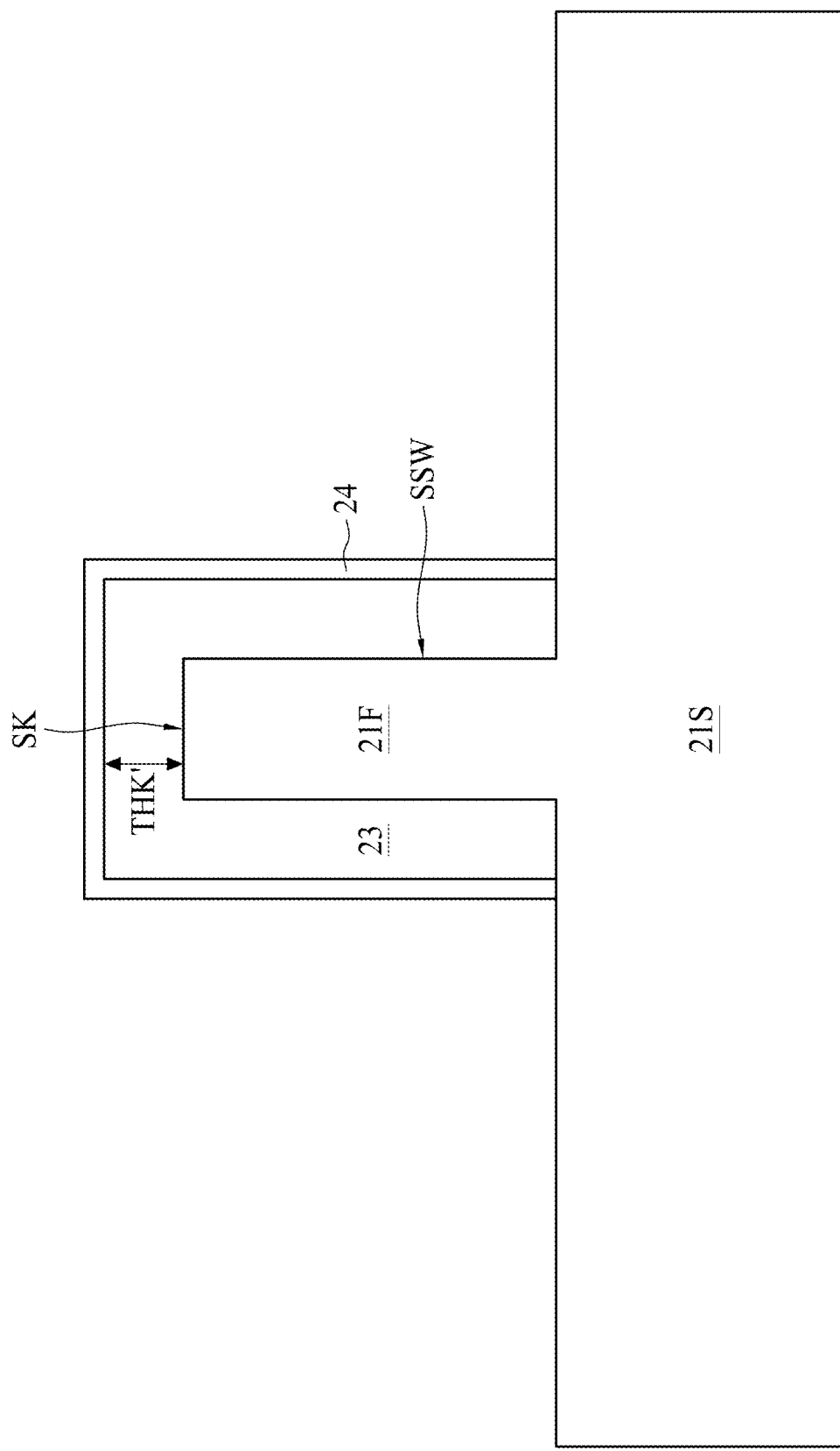
FIG. 7A is a cross sectional view of a fin field effect transistor, according to some embodiments of the present disclosure.

Similar to the device 100 discussed in FIG. 1 to FIG. 6H, the ferroelectric layer can also be incorporated into semiconductor fin of device 2000, as will be discussed in FIG. 7A to FIG. 9G. Referring to FIG. 7A, FIG. 7A is a cross sectional view of a fin field effect transistor, according to some embodiments of the present disclosure. A fin 21S (such as an active fin) is formed over a substrate 21S. The substrate 21S may be silicon, silicon germanium, germanium, silicon carbide, gallium arsenide, and the like. The substrate 21S may further be a bulk material, semiconductor on insulator (SOI), or the like. A ferroelectric layer 23 covers the sidewalls SSW and the top surface SK of the fin 21S. A material of the ferroelectric layer 23 may be similar to the material of the ferroelectric layer 3 as discussed in FIG. 1 to FIG. 6H, which may include hafnium oxide (such as HfO$_2$), or hafnium oxide doped with one of the dopant of silicon (Si), nitrogen (N), lanthanum (La), aluminum (Al), yttrium (Y), zirconium (Zr), or the like, can be a material of the ferroelectric layer 23. Herein, ranges of the dopant concentration of the aforesaid dopants can be: Si in a range from about 3% to about 7%, N in a range from about 3% to about 5%, La in a range from about 5% to about 10%, Al in a range from about 3% to about 7%, Y from about 3% to about 7%, Zr from about 40% to about 60%. A thickness THK' of the ferroelectric layer 23 may be in a range from about 3 nm to about 5 nm, wherein the ferroelectric layer 23 having a thickness in such range may show improved effect of generating compression/tensile strain, serve as a gate dielectric, and/or achieving minimizing size of the device 2000. A metal gate layer 24 is formed over the ferroelectric layer 23. In the case of the ferroelectric layer 23 includes HfO$_2$, a volume of HfO$_2$ of orthorhombic phase is greater than half of the total volume of the ferroelectric layer 23.

Figure 7B:
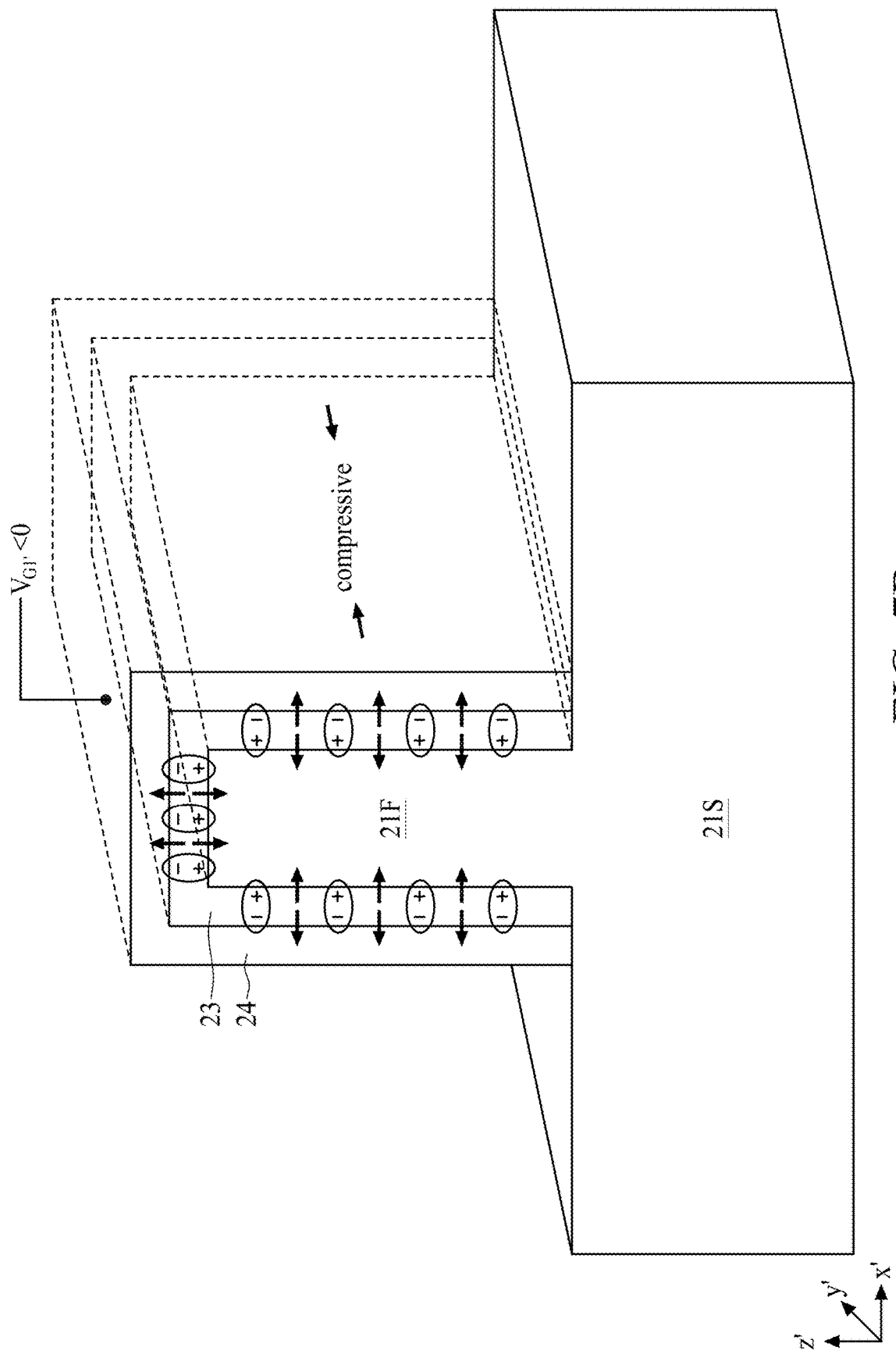
FIG. 7B is a schematic drawing showing a direction of strain generated in a fin field effect transistor, according to some embodiments of the present disclosure.
Figure 7C:
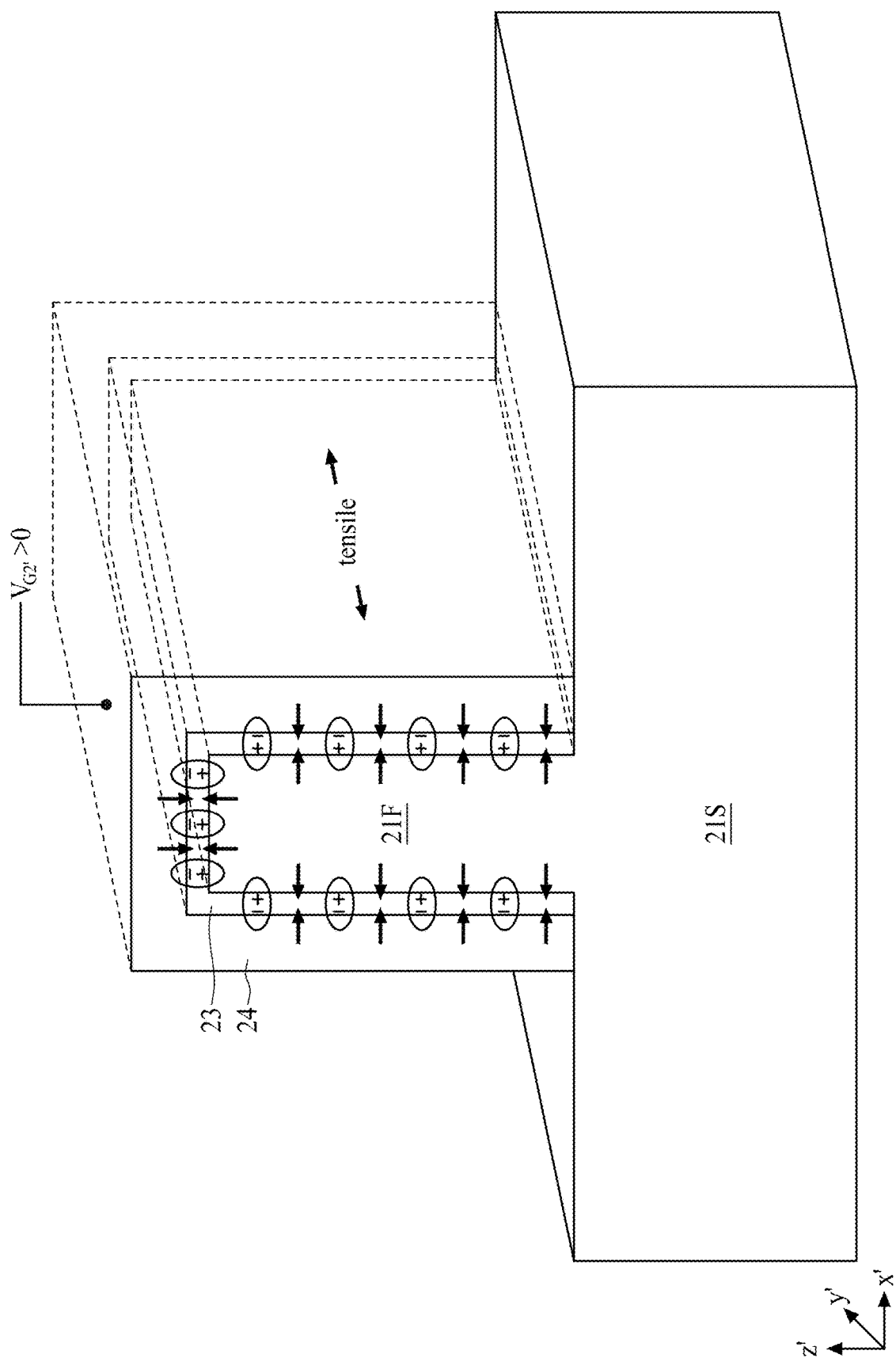
FIG. 7C is a schematic drawing showing a direction of strain generated in a fin field effect transistor, according to some embodiments of the present disclosure.

Referring to FIG. 7B and FIG. 7C, FIG. 7B is a schematic drawing showing a direction of strain generated in a fin field effect transistor, FIG. 7C is a schematic drawing showing a direction of strain generated in a fin field effect transistor, according to some embodiments of the present disclosure. Herein z'-direction is perpendicular to a surface of the substrate 21S, the fin FS extends along y'-direction, and x'-direction is perpendicular to the y'-direction and the z'-direction. The ferroelectric layer 23 is configured to cause a tensile strain or compression strain in the fin 21F. As shown in FIG. 7B, when the voltage applied to the metal gate layer 24 is applied with a first electric field $V_{G1'}$, which may be negative (<0) or alternatively less than a threshold value (Vt', which is a voltage value for which the ferroelectric layer 23 converts from one state to another state, wherein the value is based on a specific type of the ferroelectric material), the ferroelectric layer 23 may expand and thereby inducing a compression strain in the fin 21F to counterbalance the expansion of the ferroelectric layer 23. A channel region in proximity to the surfaces of the fin 21F interfacing with the ferroelectric layer 23 may also be compressed. In some embodiments, the expansion of the ferroelectric layer 23 may at least cause a compression strain between source and drain, or along y'-direction of the fin 21F. Such technique can especially be utilized in p-type device (such as p-MOSFET).

As shown in FIG. 7C, when the voltage applied to the metal gate layer 24 is applied with a second electric field $V_{G2'}$, which may be positive (>0) or alternatively greater than a threshold value (Vt', which is a voltage value for which the ferroelectric layer 23 converts from one state to another state, wherein the value is based on a specific type of the ferroelectric material), the ferroelectric layer 23 may contract and thereby inducing a tensile strain in the fin 21F to counterbalance the contraction of the ferroelectric layer 23. A channel region in proximity to the surfaces of the fin 21F interfacing with the ferroelectric layer 23 may also be applied with tensile strain. In some embodiments, the contraction of the ferroelectric layer 23 may at least cause a tensile strain between source and drain, or along y'-direction of the fin 21F. Such technique can especially be utilized in n-type device (such as n-MOSFET).

Figure 8A:
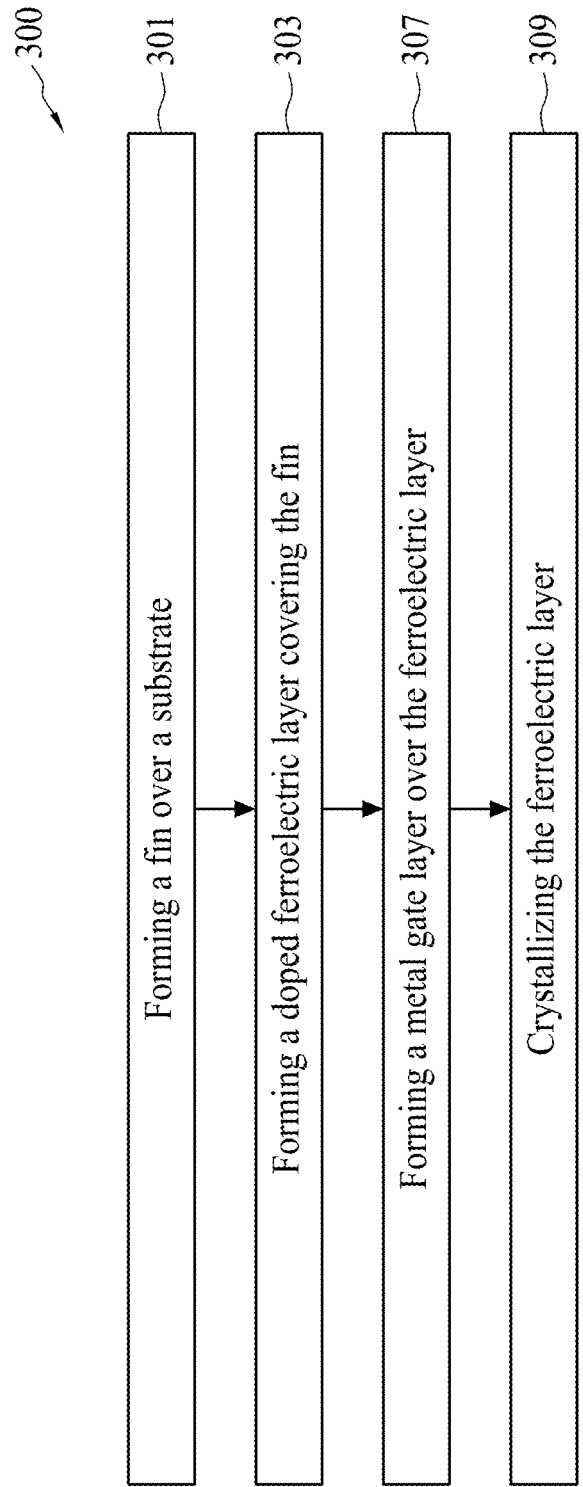
FIG. 8A shows a flow chart representing method of fabricating a fin field effect transistor, in accordance with some embodiments of the present disclosure.

Referring to FIG. 8A, FIG. 8A shows a flow chart representing method of fabricating a fin field effect transistor, in accordance with some embodiments of the present disclosure. The method 300 for fabricating a semiconductor structure includes forming a fin over a substrate (operation 301, which can be referred to FIG. 9A), forming a doped ferroelectric layer covering the fin (operation 303, which can be referred to FIG. 9B to FIG. 9E), forming a metal gate layer over the ferroelectric layer (operation 307, which can be referred to FIG. 9F), and crystallizing the ferroelectric layer (operation 309, which can be referred to FIG. 9G).

Figure 8B:
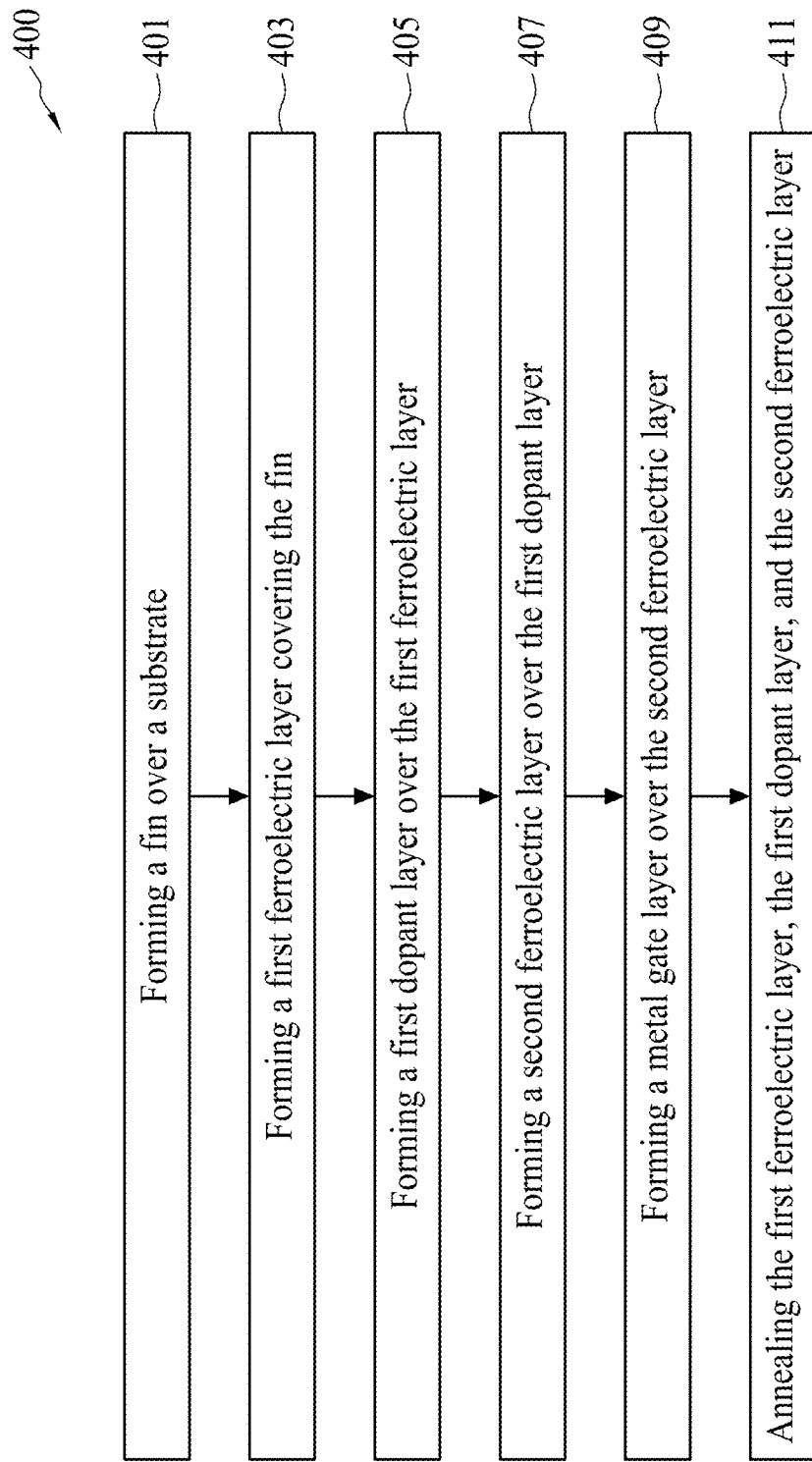
FIG. 8B shows a flow chart representing method of fabricating a fin field effect transistor, in accordance with some embodiments of the present disclosure.

Referring to FIG. 8B, FIG. 8B shows a flow chart representing method of fabricating a fin field effect transistor, in accordance with some embodiments of the present disclosure. The method 400 for fabricating a semiconductor structure includes forming a fin over a substrate (operation 401, which can be referred to FIG. 9A), forming a first ferroelectric layer covering the fin (operation 403, which can be referred to FIG. 9B), forming a first dopant layer over the first ferroelectric layer (operation 405, which can be referred to FIG. 9C), forming a second ferroelectric layer over the first dopant layer (operation 407, which can be referred to FIG. 9D), forming a metal gate layer over the second ferroelectric layer (operation 409, which can be referred to FIG. 9F), annealing the first ferroelectric layer, the first dopant layer, and the second ferroelectric layer (operation 411, which can be referred to FIG. 9G).

Figure 9A:
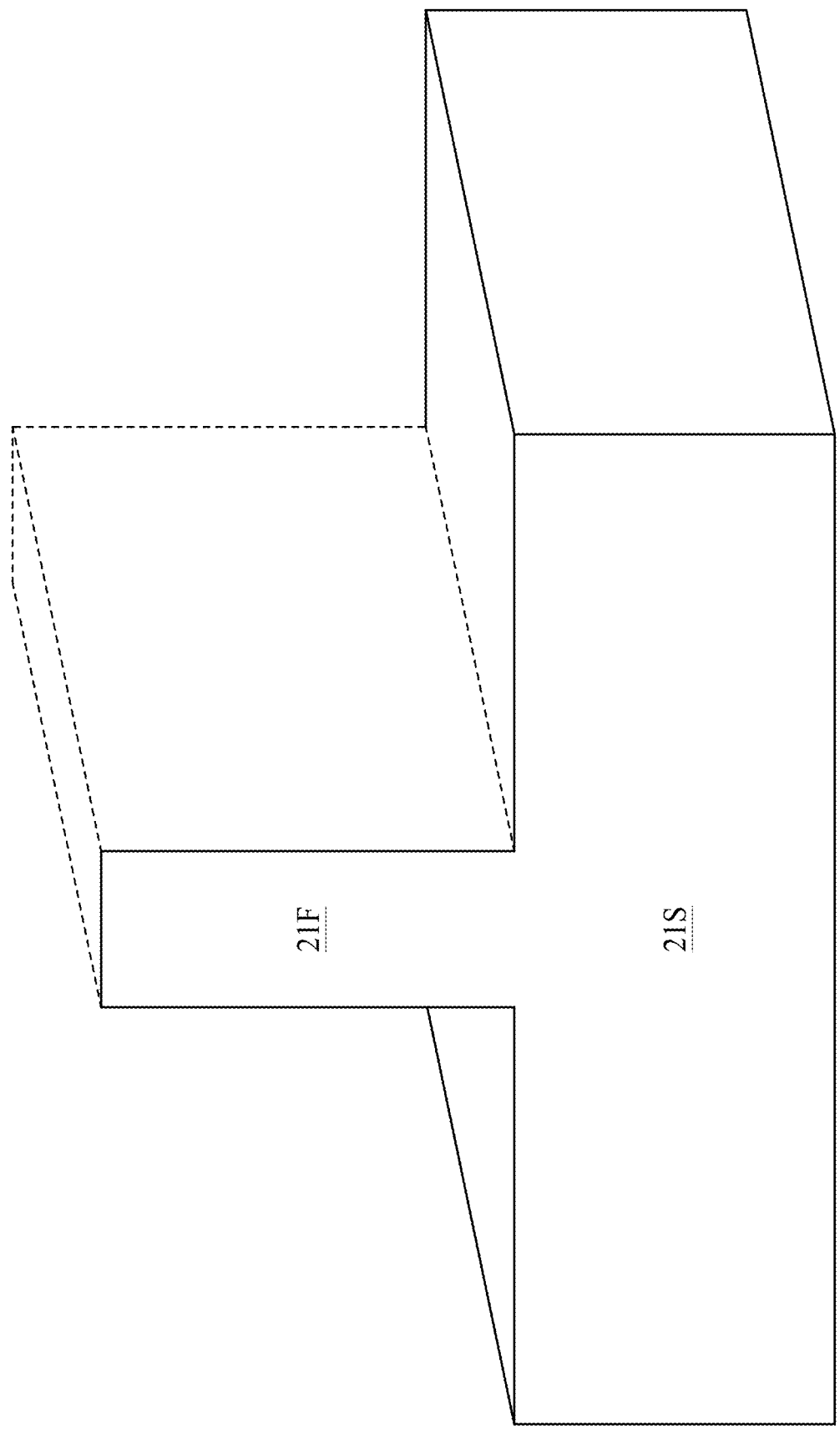
FIG. 9A is a perspective view of a fin field effect transistor during intermediate stages of manufacturing operations, according to some embodiments of the present disclosure.

Referring to FIG. 9A, FIG. 9A is a perspective view of a fin field effect transistor during intermediate stages of manufacturing operations, according to some embodiments of the present disclosure. A fin 21F is formed on a substrate 21S.

Referring to FIG. 9B, FIG. 9B is a cross sectional view of a fin field effect transistor during intermediate stages of manufacturing operations, according to some embodiments of the present disclosure. A first ferroelectric layer 23A is formed over a top surface SK and sidewalls SSW of the fin 21F. In some embodiments, the first ferroelectric layer 23A includes hafnium oxide, such as $HfO_2$, or the like. In some embodiments, the first ferroelectric layer 3A formed in this operation include amorphous $HfO_2$. The amorphous $HfO_2$ may be pure or undoped. In some embodiments, the first ferroelectric layer 23A is formed by in-situ atomic layer deposition (ALD) operation in order to form a first ferroelectric layer 23A with thinner thickness under improved thickness control (which may also be capable to form a layer having a thickness less than 10 nm, 5 nm or even less than 3 nm).

Figure 9C:
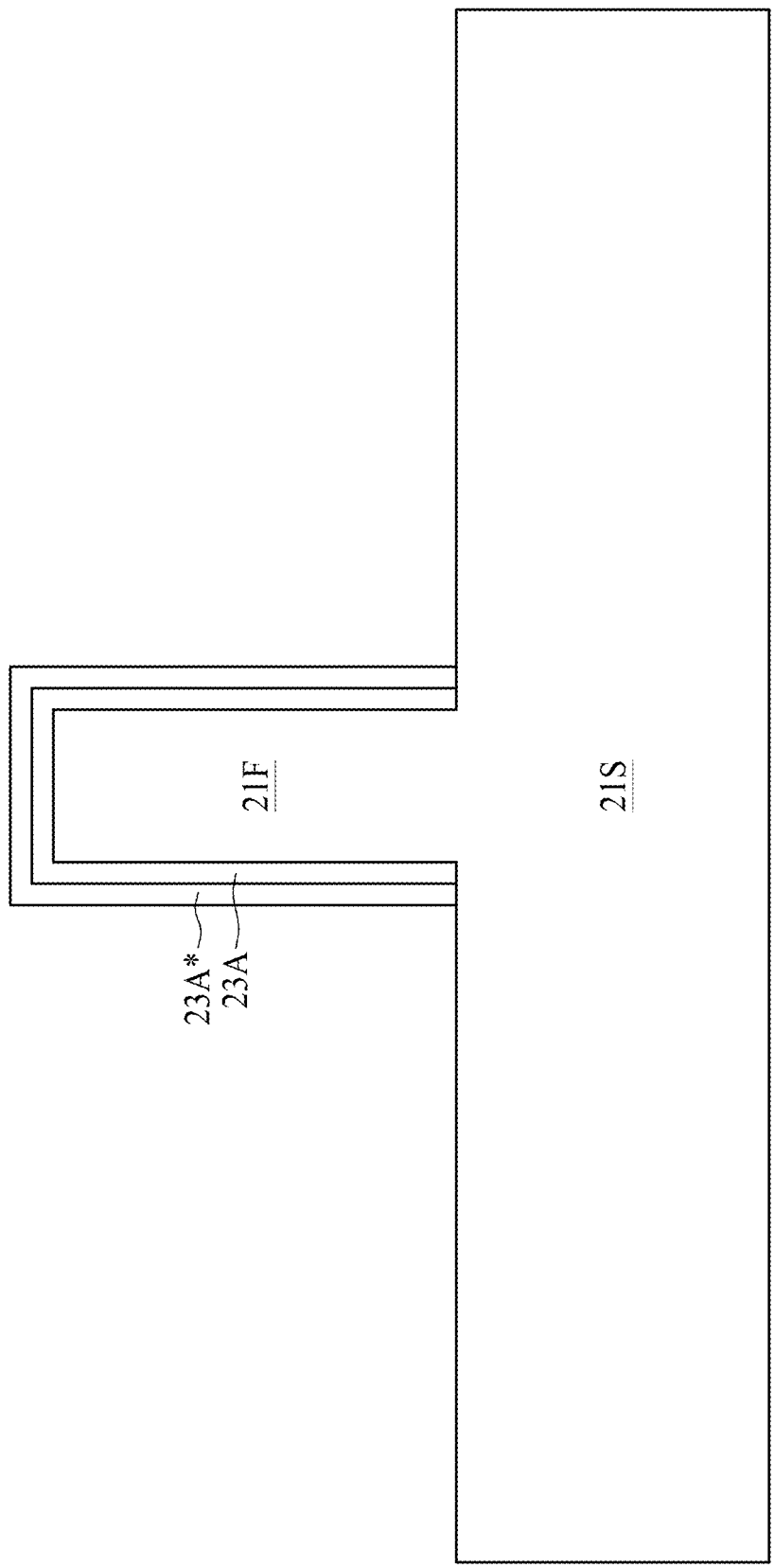
Figure 9D:
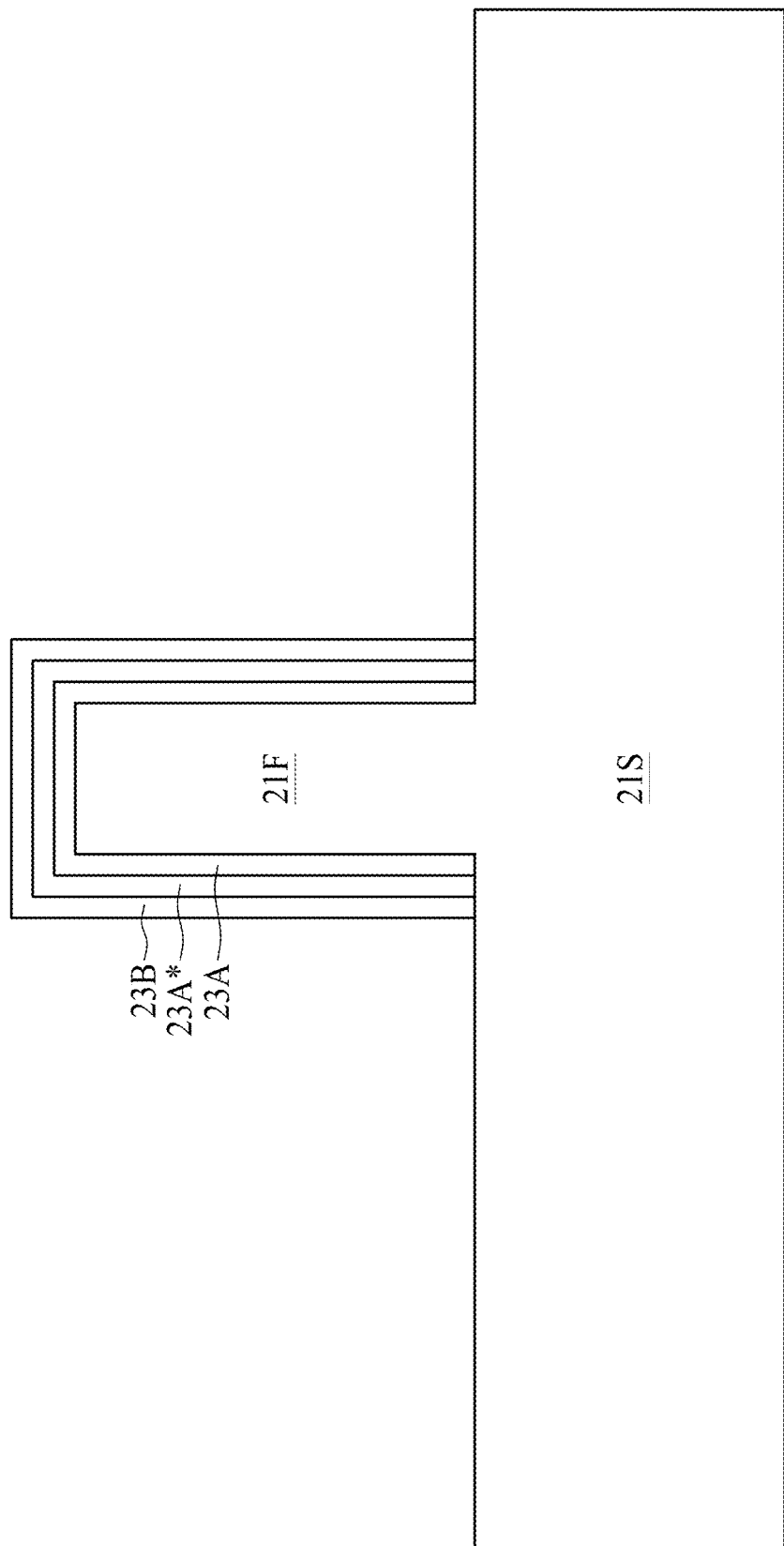
Figure 9E:
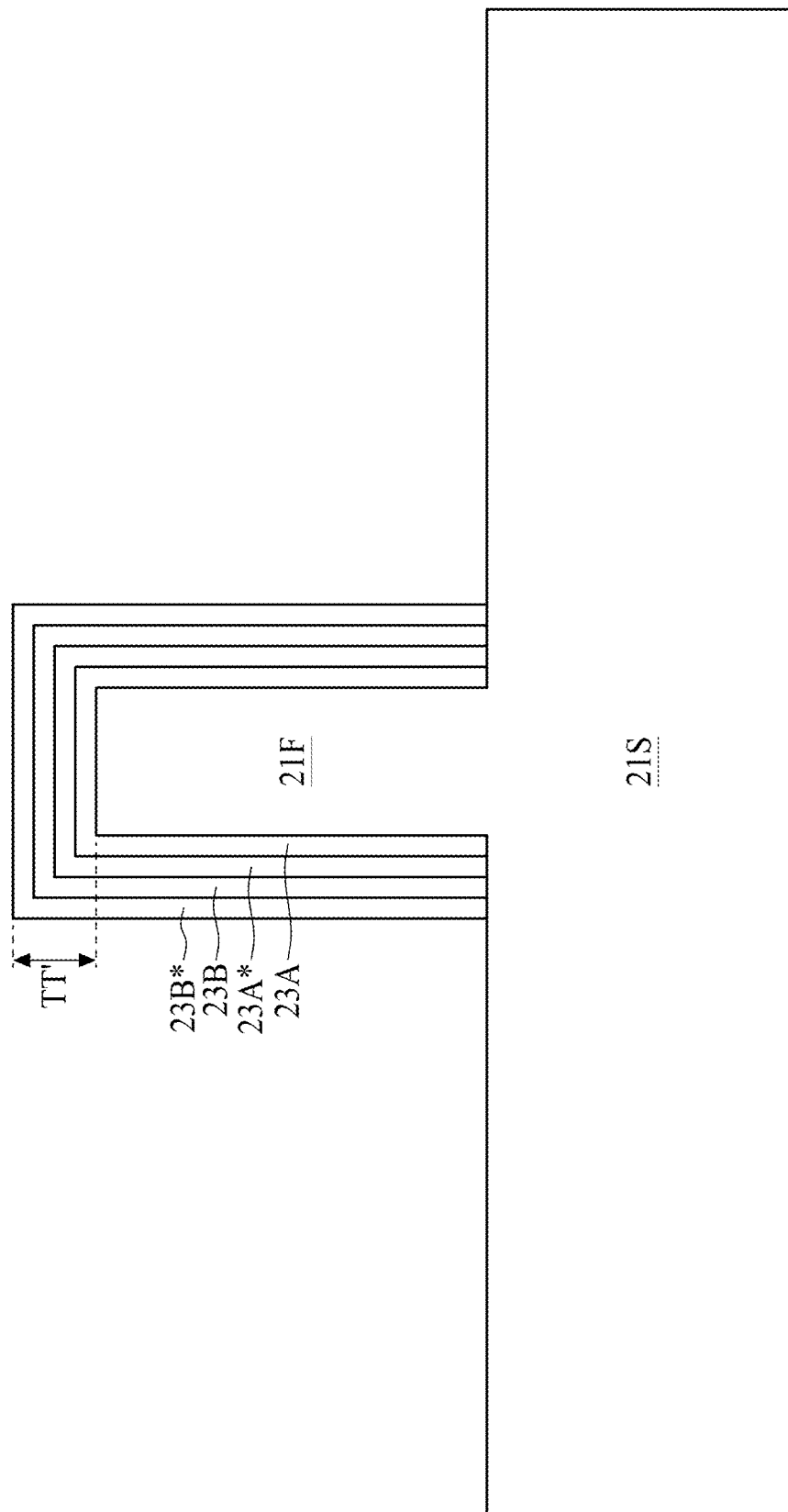

In the case of forming the ferroelectric layer 23 doped with dopant, the operations discussed in FIG. 9C to FIG. 9E can be performed. (In the case of not having the ferroelectric layer 23 doped with dopant, a thickness of the first ferroelectric layer 23A can be in a range from about 3 nm to about 5 nm.) Referring to FIG. 9C, FIG. 9C is a cross sectional view of a fin field effect transistor during intermediate stages of manufacturing operations, according to some embodiments of the present disclosure. A first dopant layer 23A* is formed over the first ferroelectric layer 23A. The first dopant layer 23A* may include one of the dopant of silicon (Si), nitrogen (N), lanthanum (La), aluminum (Al), yttrium (Y), zirconium (Zr), or the like. In some embodiments, the first dopant layer 23A* is formed by in-situ ALD operation.

Referring to FIG. 9D, FIG. 9D is a cross sectional view of a fin field effect transistor during intermediate stages of manufacturing operations, according to some embodiments of the present disclosure. A second ferroelectric layer 23B is formed over the first dopant layer 23A*. In some embodiments, a material of the second ferroelectric layer 23B may be identical or similar to the first ferroelectric layer 23A.

Referring to FIG. 9E, FIG. 9E is a cross sectional view of a fin field effect transistor during intermediate stages of manufacturing operations, according to some embodiments of the present disclosure. Optionally, one or more dopant layers and/or ferroelectric layers can be formed in the manner similar to the previously discussed FIG. 9B to FIG. 9D, until a total thickness TT' of the dopant layers and the ferroelectric layers is around a desired value. For example, a second dopant layer 23B* is formed over the second ferroelectric layer 23B, wherein the material of the second dopant layer 23B* may be identical to the first dopant layer 23A*, and may be formed by ALD operation. In some embodiments, the total thickness TT' is in a range from about 3 nm to about 5 nm, as the criticality was previously discussed in FIG. 7A. Hereinafter every dopant layers and ferroelectric layers are collectively referred as a stack 23*.

Figure 9F:
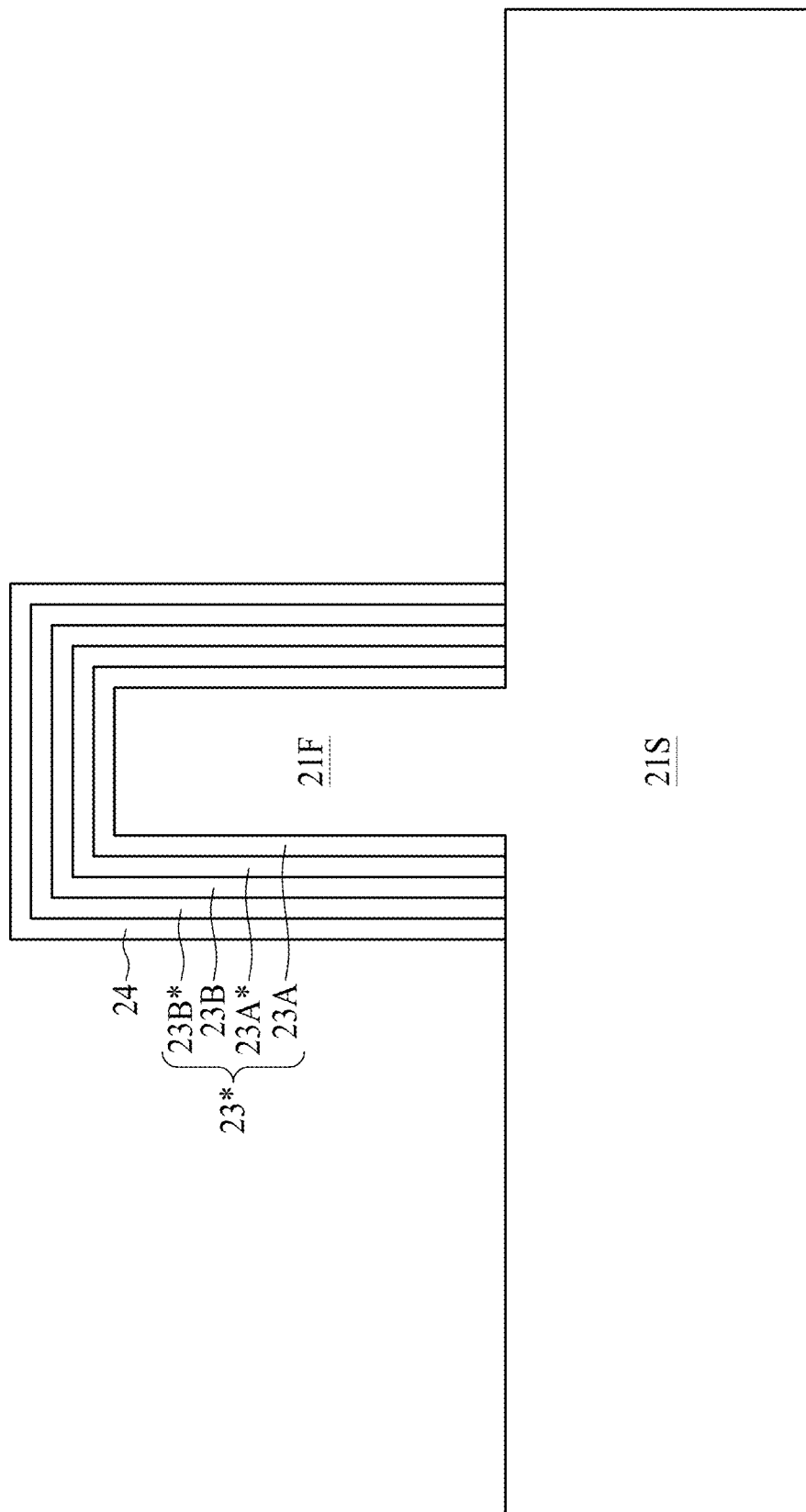

Referring to FIG. 9F, FIG. 9F is a cross sectional view of a fin field effect transistor during intermediate stages of manufacturing operations, according to some embodiments of the present disclosure. A metal gate layer 24 is formed over the stack 23*. In some of the embodiments, the metal gate layer 24 may cover the entire exposed outer surface of the stack 23*.

Figure 9G:
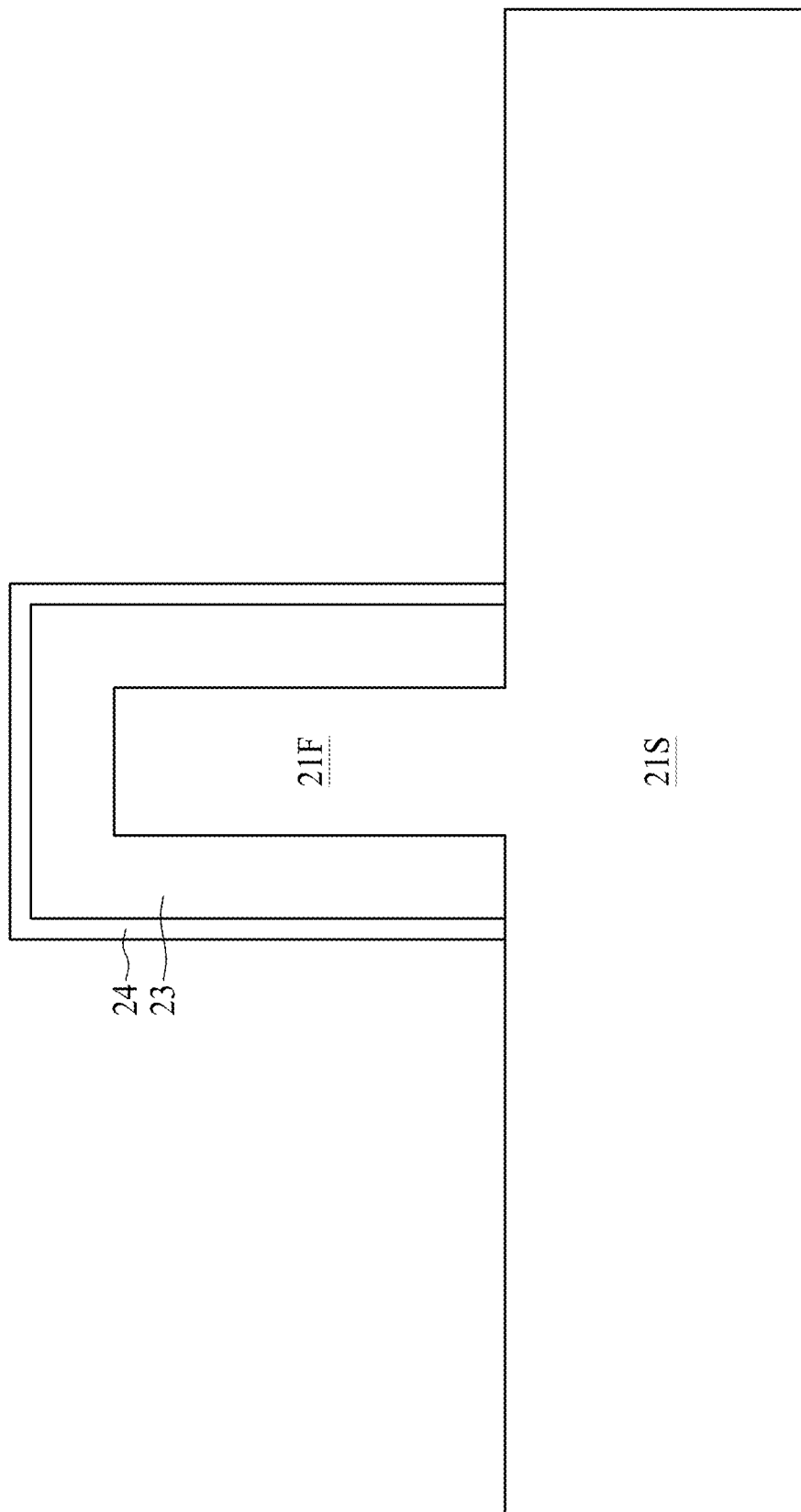

Referring to FIG. 9G, FIG. 9G is a cross sectional view of a fin field effect transistor during intermediate stages of manufacturing operations, according to some embodiments of the present disclosure. The stack 23* (including the first ferroelectric layer 23A, the first dopant layer 23A*, the second ferroelectric layer 23B, et cetera) is annealed in order to crystalize the material of the ferroelectric layers and thereby forming ferroelectric layer 23. In the case of the ferroelectric layers includes hafnium oxide (such as $HfO_2$), the amorphous hafnium oxide may be converted into one or more different phases. For example, similar to previous discussion in FIG. 4A to FIG. 4C, the annealed stack 23* may be converted into phases such as first phase T1 (e.g. orthorhombic phase), second phase T2 (e.g. monoclinic phase, such as Monoclinic-14 $P2_1/c$), and third phase T3 (e.g. tetragonal phase, such as tetragonal-137 $P4_2/nmc$). As previously discussed, a volume of $HfO_2$ of orthorhombic phase is greater than half of the total volume of the ferroelectric layer 23. In some embodiments, in order to form enough volume of $HfO_2$ of orthorhombic phase, a temperature of the annealing operation is in a range from about 650° C. to about 950° C.

Furthermore, by annealing the stack 23*, the dopant in the dopant layers 23A*, 23B* (et cetera) may be diffused into the ferroelectric layers 23A, 23B (et cetera). In the case of the dopant is one of silicon (Si), nitrogen (N), lanthanum (La), aluminum (Al), yttrium (Y), zirconium (Zr), ranges of the dopant concentration of the aforesaid dopants in the formed ferroelectric layer 23 after annealing operation can be the following: Si in a range from about 3% to about 7%, N in a range from about 3% to about 5%, La in a range from about 5% to about 10%, Al in a range from about 3% to about 7%, Y from about 3% to about 7%, Zr from about 40% to about 60%.

Figure 10:
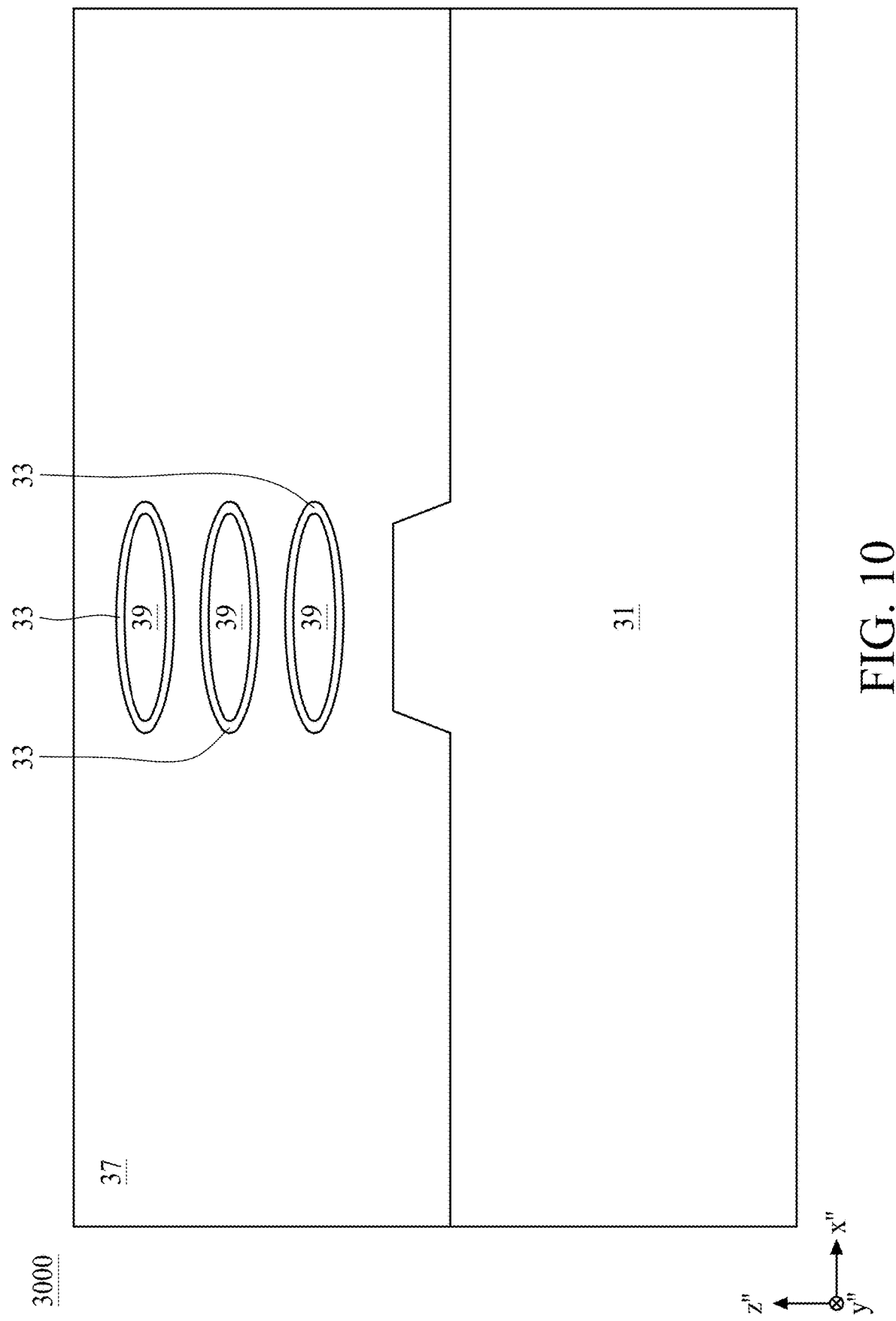
FIG. 10 is a cross sectional view of a semiconductor structure, according to some embodiments of the present disclosure.

Besides MOSFET, Complementary Metal-Oxide-Semiconductor (CMOS), FinFET, planar device as discussed, the technique discussed above may also be implemented on gate-all-around (GAA) device, nanowire, nanosheet, nanobridge, or similar devices. An example of GAA device 3000 is provided in FIG. 10. Referring to FIG. 10, FIG. 10 is a cross sectional view of a semiconductor structure, according to some embodiments of the present disclosure. A plurality of semiconductor layers 39 (which may include semiconductor materials such as silicon, silicon germanium, or any suitable material that is utilized in nanowire) is formed above a substrate 31. A ferroelectric layer 33 is formed to surround each of the semiconductor layers 39. A material of the ferroelectric layer 33 may be similar to the material of the ferroelectric layer 3 as discussed in FIG. 1 to FIG. 6H, or the ferroelectric layer 23 as discussed in FIG. 7A to FIG. 9G. A metal gate layer 37 is formed over the substrate 31 to surround the semiconductor layers 39 and spacing between each of the semiconductor layers 39. Herein z"-direction is perpendicular to a surface of the substrate 21S, the semiconductor layers 39 extends along y"-direction, and x"-direction is perpendicular to the y"-direction and the z"-direction.

Similar to the discussion in FIG. 7B and FIG. 7C, compression strain/tensile strain may be applied to the semiconductor layers 39 by applying different voltage (such as negative/positive or alternatively lower/higher than threshold voltage). Also, similar to the operations discussed in FIG. 5A to FIG. 6H or FIG. 8A to FIG. 9F, the ferroelectric layer 33 can be formed by forming one or more ferroelectric layers and/or one or more dopant layers doped with the dopants discussed above (utilizing ALD operation), and annealed the ferroelectric layers and/or the dopant layers. In the case of the ferroelectric layers includes hafnium oxide (such as $HfO_2$), the amorphous hafnium oxide may be converted into one or more different phases. For example, similar to previous discussion in FIG. 4A to FIG. 4C, multiple phases such as first phase T1 (e.g. orthorhombic phase, such as Orthorhombic-29 $Pca2_1$), second phase T2 (e.g. monoclinic phase, such as Monoclinic-14 $P2_1/c$), and third phase T3 (e.g. tetragonal phase, such as tetragonal-137 P4$_2$/nmc) may be formed. As previously discussed, a volume of HfO$_2$ of orthorhombic phase is greater than half of the total volume of the ferroelectric layer 33. In some embodiments, in order to form enough volume of HfO$_2$ of orthorhombic phase, a temperature of the annealing operation is in a range from about 650° C. to about 950° C. In some of the embodiments, the annealing operation may optionally be performed after the metal gate layer 37 is formed.

The present disclosure provides improved semiconductor devices and methods for forming the semiconductor devices in order to improve the accessibility of adjusting a strain in channel region/fin area/nanowires by applying an electrical field after the device is fabricated. Since the sizes of devices are required to be smaller and smaller in the technology trend, a thinner gate dielectric is entailed. The ferroelectric layers 3, 23, 33 provided in the present disclosure may be utilized as a gate dielectric and as a strain-adjusting mean that can deform in accordance with an applied voltage thereon. In the case of the ferroelectric layers 3, 23, 33 includes HfO$_2$ or other hafnium oxide-based materials, such materials can be formed by ALD operation that has relatively greater thickness control and allows formed layers to be thinner. In addition, in order to improve the stability and properties of the ferroelectric layers 3, 23, 33, dopants such as silicon, nitrogen, lanthanum, aluminum, yttrium, or zirconium having a concentration in proper ranges can be utilized. The present disclosure provides materials/compositions/concentration of dopants that may help improving the ferroelectricity of the ferroelectric layers 3, 23, 33. In some embodiments, the ferroelectricity of the ferroelectric layers 3, 23, 33 may be improved by utilizing the aforesaid operations, thus improving the effect of generating strain, especially, the method of doping the ferroelectric layers 3, 23, 33 can be compatible with the operations of forming the ferroelectric layers 3, 23, 33.

Some embodiments of the present disclosure provide a semiconductor device, including a substrate, a metal gate layer over the substrate, a channel between a source region and a drain region in the substrate, and a ferroelectric layer between the metal gate layer and the substrate, wherein the ferroelectric layer is configured to cause a strain in the channel when applied with an electrical field.

Some embodiments of the present disclosure provide a method for forming a semiconductor device, including forming a fin over a substrate, forming a dummy gate over the fin, forming a spacer on a sidewall of the dummy gate, removing the dummy gate to expose a first portion of the substrate, forming a ferroelectric layer on the first portion of the substrate, doping the ferroelectric layer with a dopant, forming a metal gate layer over the ferroelectric layer, and crystallizing the ferroelectric layer.

Some embodiments of the present disclosure provide a method for fabricating a semiconductor device, including forming a fin over a substrate, forming a dummy gate over the fin, forming a spacer on a sidewall of the dummy gate, defining a channel in a substrate by forming a source region and a drain region, removing the dummy gate, forming a first ferroelectric layer having a U-shaped profile on an inner sidewall of the spacer, forming a first dopant layer over the first ferroelectric layer, forming a second ferroelectric layer over the first dopant layer, forming a metal gate layer over the second ferroelectric layer, and annealing the first ferroelectric layer, the first dopant layer, and the second ferroelectric layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, comprising:
   forming a fin over a substrate;
   forming a dummy gate over the fin;
   forming a spacer on a sidewall of the dummy gate;
   removing the dummy gate to expose a first portion of the substrate;
   forming a ferroelectric layer on the first portion of the substrate, wherein the ferroelectric layer comprises a hafnium oxide-based material;
   doping the ferroelectric layer with a dopant;
   forming a metal gate layer over the ferroelectric layer; and
   crystallizing the ferroelectric layer subsequent to forming the metal gate layer over the ferroelectric layer, comprising:
      converting the hafnium oxide-based material into a first portion of hafnium oxide with orthorhombic phase, a second portion of hafnium oxide with monoclinic phase, and a third portion of the hafnium oxide with tetragonal phase, wherein a first volume of the first portion is greater than a second volume of the second portion, and the second volume of the second portion is greater than a third volume the third portion.

2. The method of claim 1, wherein crystallizing the ferroelectric layer comprises:
   converting the hafnium oxide-based material from amorphous state to crystalized state by an annealing operation.

3. The method of claim 1, wherein crystallizing the ferroelectric layer comprises elevating a temperature to a range of from about 650° C. to about 950° C.

4. The method of claim 1, wherein forming the ferroelectric layer and doping the ferroelectric layer comprise performing a plurality of atomic layer deposition (ALD) cycles.

5. The method of claim 1, wherein the metal gate layer is formed after doping the ferroelectric layer.

6. A method for forming a semiconductor structure, comprising:
   forming a fin over a substrate;

forming a dummy gate over the fin;
forming a spacer on a sidewall of the dummy gate;
defining a channel in a substrate by forming a source region and a drain region;
removing the dummy gate;
forming a first ferroelectric layer having a U-shaped profile on an inner sidewall of the spacer;
forming a first dopant layer over the first ferroelectric layer;
forming a second ferroelectric layer over the first dopant layer;
forming a metal gate layer over the second ferroelectric layer; and
annealing the first ferroelectric layer, the first dopant layer, and the second ferroelectric layer.

7. The method of claim 6, wherein the first dopant layer comprises at least one of the silicon, nitrogen, lanthanum, aluminum, yttrium, or zirconium.

8. The method of claim 6, wherein the first ferroelectric layer, the first dopant layer, and the second ferroelectric layer are formed by atomic layer deposition (ALD).

9. The method of claim 6, wherein annealing the first ferroelectric layer, the first dopant layer, and the second ferroelectric layer comprises elevating a temperature to a range of from about 650° C. to about 950° C.

10. The method of claim 6, wherein a portion of the first ferroelectric layer conforms to an inner sidewall of the spacer, and a portion of the first dopant layer conforms to an inner sidewall of the first ferroelectric layer.

11. The method of claim 6, wherein annealing the first ferroelectric layer, the first dopant layer, and the second ferroelectric layer comprises a crystallization process.

12. The method of claim 11, wherein more than half of a total volume of the first ferroelectric layer, the first dopant layer, and the second ferroelectric layer is converted into orthorhombic phase after annealing.

13. A method for forming a semiconductor structure, comprising:
forming a source region proximal to a first side of the substrate;
forming a drain region apart from the source region; and
forming a gate over an area between the source region and the drain region, comprising:
forming a spacer above the first side of the substrate;
forming a ferroelectric stack at least laterally surrounded by the spacer, wherein the ferroelectric stack comprises amorphous hafnium oxide;
forming a gate material layer at least partially surrounded by the ferroelectric stack; and
converting amorphous hafnium oxide of the ferroelectric stack into a first portion of hafnium oxide with orthorhombic phase, a second portion of hafnium oxide with monoclinic phase, and a third portion of hafnium oxide with tetragonal phase, wherein a volume of the first portion is greater than a volume of the second portion, and the volume of the second portion is greater than a volume of the third portion.

14. The method of claim 13, wherein converting amorphous hafnium oxide of the ferroelectric stack comprises performing an annealing operation.

15. The method of claim 14, wherein the annealing operation is performed at a temperature in range from 650° C. to 950° C.

16. The method of claim 14, wherein the annealing operation is performed subsequent to forming the gate material layer.

17. The method of claim 13, wherein forming the ferroelectric stack comprise performing a plurality of atomic layer deposition (ALD) cycles.

18. The method of claim 13, further comprising doping a dopant in the ferroelectric stack.

19. The method of claim 18, wherein the dopant comprises silicon, nitrogen, lanthanum, aluminum, yttrium, or zirconium.

20. The method of claim 13, wherein the first portion of hafnium oxide with orthorhombic phase is greater than 50% of a total volume of the ferroelectric stack.

* * * * *